(12) United States Patent
Inoue

(10) Patent No.: US 6,714,282 B2
(45) Date of Patent: Mar. 30, 2004

(54) POSITION DETECTING METHOD OPTICAL CHARACTERISTIC MEASURING METHOD AND UNIT, EXPOSURE APPARATUS, AND DEVICE MANUFACTURING METHOD

(75) Inventor: Fuyuhiko Inoue, San Mateo, CA (US)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 10/023,708

(22) Filed: Dec. 21, 2001

(65) Prior Publication Data

US 2002/0122163 A1 Sep. 5, 2002

(30) Foreign Application Priority Data

Dec. 25, 2000 (JP) .......................... 2000-392098

(51) Int. Cl.[7] ..................... G03B 27/52; G03B 27/42
(52) U.S. Cl. ................................. 355/55; 355/53
(58) Field of Search ................. 355/52–53, 55, 355/67–71, 77; 356/357, 399–401; 250/548

(56) References Cited

U.S. PATENT DOCUMENTS

| | | | |
|---|---|---|---|
| 4,326,800 A | 4/1982 | Fitts | 356/152 |
| 4,490,039 A | 12/1984 | Bruckler et al. | |
| 4,932,781 A * | 6/1990 | Kuwayama | 356/357 |
| 5,233,174 A | 8/1993 | Zmek | |
| 5,493,391 A | 2/1996 | Neal et al. | |
| 5,539,718 A | 7/1996 | Hoshi et al. | 369/100 |
| 5,610,897 A | 3/1997 | Yamamoto et al. | 369/124 |
| 5,760,879 A * | 6/1998 | Shinonaga et al. | 355/55 |
| 5,828,455 A | 10/1998 | Smith et al. | |
| 5,864,381 A | 1/1999 | Neal et al. | |
| 5,898,501 A * | 4/1999 | Suzuki et al. | 356/359 |
| 5,912,731 A | 6/1999 | DeLong et al. | 356/121 |
| 5,936,720 A | 8/1999 | Neal et al. | |
| 5,978,085 A | 11/1999 | Smith et al. | |
| 6,052,180 A | 4/2000 | Neal et al. | |
| 6,130,419 A | 10/2000 | Neal | |
| 6,184,974 B1 | 2/2001 | Neal et al. | |
| 6,278,514 B1 * | 8/2001 | Ohsaki | 355/55 |
| 6,360,012 B1 | 3/2002 | Kreuzer | 382/211 |

FOREIGN PATENT DOCUMENTS

EP  1 079 223  2/2001

OTHER PUBLICATIONS

W. Freitag, et al., Jr, pp. 8–12, "Wavefront Analysis of Photolithographic Lenses", Jan. 1991.

T. Noguchi, et al., Publ. Natl. Astron. Obs. Japan, vol. 1, pp. 49–55, "Active Optics Experiments. I.", 1989.

* cited by examiner

Primary Examiner—Henry Hung Nguyen
(74) Attorney, Agent, or Firm—Oblon, Spivak, McClelland, Maier & Neustadt, P.C.

(57) ABSTRACT

An optical characteristic measuring method with which to measure an optical characteristic of an optical system to be examined. The optical characteristic measuring method includes detecting positions of a plurality of features in a picked-up image by repeating a calculating step of image information, a calculating step of comparison feature positions, and a correcting and updating step of current estimated feature positions, until the differences between an initial estimated feature positions and the comparison feature positions become at or below a permissible limit, and calculating an optical characteristic of the optical system to be examined based on the detected positions of the plurality of features.

20 Claims, 14 Drawing Sheets

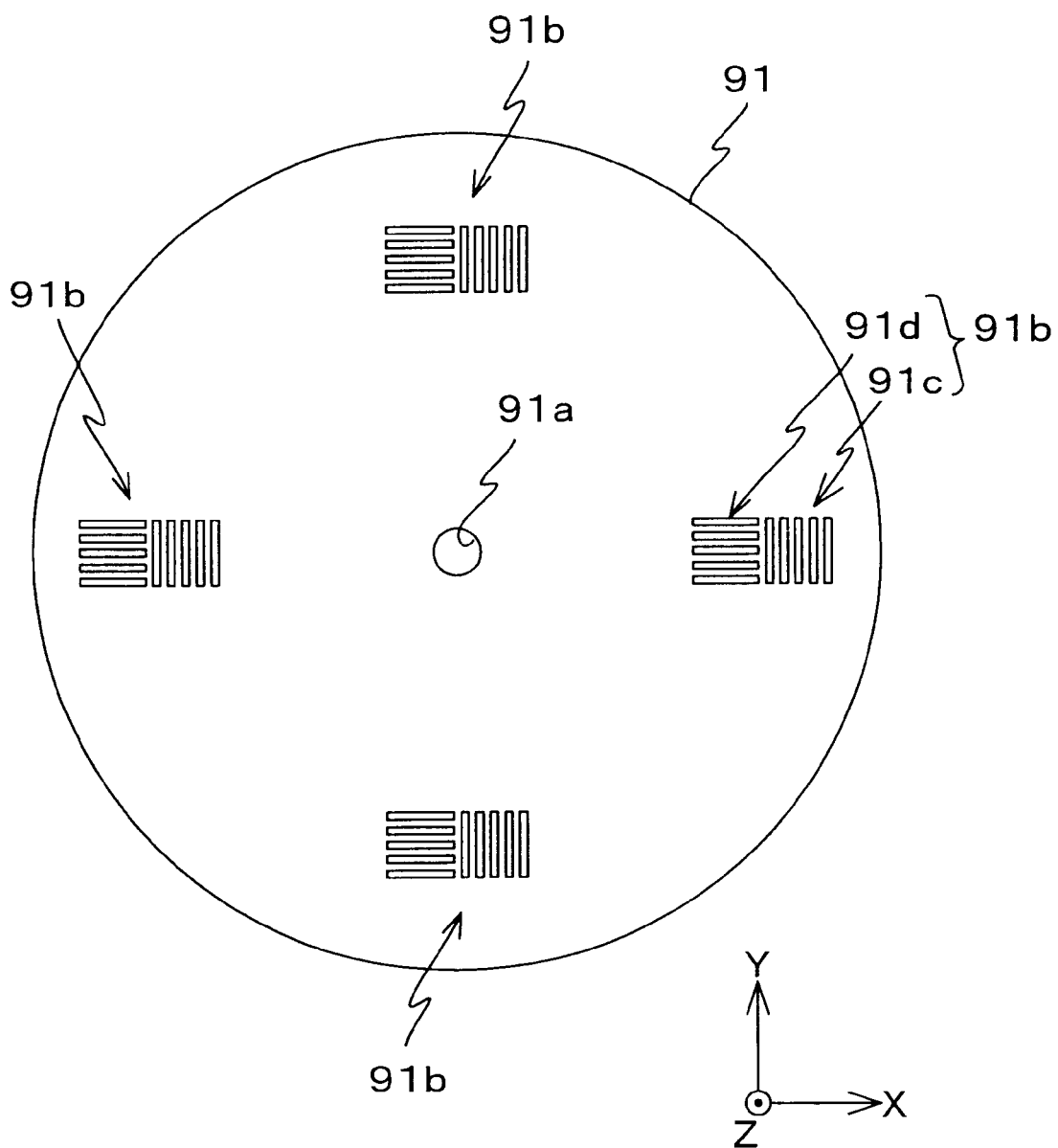

POSITION DETECTING METHOD OPTICAL CHARACTERISTIC MEASURING METHOD AND UNIT, EXPOSURE APPARATUS, AND DEVICE MANUFACTURING METHOD

BACKGROUND OF THE INVENTION

1. Field of The Invention

The present invention relates to a position detecting method, an optical characteristic measuring method and unit, an exposure apparatus, and a device manufacturing method, and more specifically to a position detecting method for detecting the positions of a plurality of features in an image formed on the image plane of an optical system, an optical characteristic measuring method and unit for measuring an optical characteristic of an optical system to be examined using the position detecting method, an exposure apparatus comprising the optical characteristic measuring unit, and a device manufacturing method using the exposure apparatus.

2. Description of The Related Art

In a lithography process for manufacturing semiconductor devices, liquid crystal display devices, or the like, exposure apparatuses have been used which transfer a pattern (also referred to as a "reticle pattern" hereinafter) formed on a mask or reticle (generically referred to as a "reticle" hereinafter) onto a substrate, such as a wafer or glass plate (hereinafter, generically referred to as a "substrate" as needed), coated with a resist through a projection optical system. As such an exposure apparatus, a stationary-exposure-type projection exposure apparatus such as the so-called stepper, or a scanning-exposure-type projection exposure apparatus such as the so-called scanning stepper is mainly used.

Such an exposure apparatus needs to accurately project the pattern on a reticle onto a substrate with high resolving power. Therefore, the projection optical system is designed to have a good optical characteristic with various types of aberrations being reduced.

However, it is difficult to make a projection optical system completely as is planned in design, and various types of aberrations due to various factors remain in a projection optical system actually made. Therefore, the optical characteristic of the projection optical system actually made is not the same as planned in design.

Various technologies for measuring the optical characteristic, related to aberration, of the actually made projection optical system as an optical system to be examined have been suggested, and of those technologies a wave-front aberration measuring method is attracting attentions, which comprises (a) making a spherical wave produced by a pinhole incident on the optical system to be examined, (b) producing parallel rays of light from light that has passed through the optical system to be examined and forms a pinhole image and dividing the wave front thereof into a plurality of portions, (c) making each of the portions (hereinafter, called "divided wave-front portions") form a spot image, and (d) calculating wave-front aberration due to the optical system based on measured positions where the spot images are formed.

A wave-front aberration measuring unit using this method may comprise a micro-lens array, in which a plurality of micro lenses are arranged along a two-dimensional plane parallel to the ideal wave front of the parallel rays of light, as a wave-front dividing device for dividing the incident light and making each of the divided wave-front portions form a spot image. The wave-front aberration measuring unit picks up the spot images by a pick-up device such as CCD and calculates wave-front aberration based on deviations of the spot images' positions, which are detected from the pick-up result, from positions planned in design.

Since such a wave-front aberration measuring unit with the micro-lens array can pick up the spot images formed by the divided wave-front portions at one time, the unit is excellent in terms of quickly measuring wave front aberration.

As a premise of measuring wave front aberration, the tilts of the divided wave-front portions, if any, can be considered linear. Therefore, the wave front is preferably divided into as small portions as possible in order to accurately measure the wave front aberration.

However, as the divided wave-front portions become smaller, the distances between the spot images formed through the micro lenses of the micro-lens array become short. As a result, in view of the whole image including the spot images the position of the spot image formed through a micro lens is influenced by the spot images formed through its neighboring micro lenses. That is, cross-talks between spot images, especially between spot images adjacent to each other, are not negligible, which cause the shapes of the spot images to be distorted relative to the original shape thereof, so that the positions of the spot images obtained from the pick-up result are displaced from the real positions thereof by their respective neighboring spot images.

When spot images near a given spot image are symmetrically arranged around the given spot image, the influences from the neighboring spot images cancel each other, so that the displacement of the given spot image does not occur. Meanwhile, when spot images near a given spot image are asymmetrically arranged around the given spot image, the influences from the neighboring spot images do not cancel each other, and at least parts of the influences remain, so that the given spot image is displaced. Therefore, when spot images near a given spot image are asymmetrically arranged around the given spot image, the accuracy in detecting the real position of the given spot image decreases. Especially, no spot image exists on one side in a specific direction of a spot image present in the periphery of the whole image corresponding to the periphery of the pupil, so that the asymmetry of the arrangement of spot images is large in the periphery. Therefore, the accuracy in detecting positions of such a spot image is affected to a great extent with causing the measurement accuracy in measuring wave front aberration to decrease.

DISCLOSURE OF INVENTION

This invention was made under such circumstances, and a first purpose of the present invention is to provide a position detecting method which can accurately detect the real positions of a plurality of features even when cross-talks are present between the plurality of features formed on the image plane.

Moreover, a second purpose of the present invention is to provide an optical characteristic measuring method and unit which accurately detects the optical characteristic of an optical system to be examined.

Furthermore, a third purpose of the present invention is to provide an exposure apparatus that can accurately transfer a given pattern onto a substrate.

Moreover, a fourth purpose of the present invention is to provide a device manufacturing method which can manufacture highly integrated devices having a fine pattern thereon.

According to knowledge obtained from the study by the inventor of this invention, it is possible to make an optical system including the micro-lens array, which is used for measuring wave front aberration, as planned in design, and when the optical system is made as planned in design, the whole image data on the image plane when real spot images are assumed to be present in estimated positions can be accurately calculated based on the optical model of the optical system, in which whole image data spot images assumed to be present in the estimated positions are superposed. This invention was made on the basis of such knowledge.

According to a first aspect of the present invention, there is provided a position detecting method with which to detect positions of a plurality of features in an image formed on an image plane by a predetermined optical system, the position detecting method comprising calculating initial estimated feature positions of the plurality of features using a specific algorism based on the image formed on the image plane; calculating image information on the image plane using a model for the predetermined optical system in view of the features being formed in respective current estimated feature positions; calculating comparison feature positions using the specific algorism based on the image information; correcting the current estimated feature positions by amounts corresponding to differences between the initial estimated feature positions and the comparison feature positions, so that the current estimated feature positions are updated; and repeating the calculating of image information, the calculating of comparison feature positions, and the correcting and updating of the current estimated feature positions.

According to this, initial estimated feature positions are calculated using a specific algorism, and are set as current estimated feature positions. Subsequently, image information on the image plane is calculated using a predetermined optical model and assuming the current estimated feature positions to be real feature positions, and comparison feature positions are calculated using the specific algorism and assuming that an image calculated based on the image information is formed on the image plane.

The differences between the initial estimated feature positions and the comparison feature positions are approximations of the differences between the current estimated feature positions and the real feature positions, and if the differences between the initial estimated feature positions and the comparison feature positions are at or below a permissible limit, the current estimated feature positions are taken as the real feature positions.

Meanwhile, if the differences between the initial estimated feature positions and the comparison feature positions are larger than the permissible limit, the current estimated feature positions are replaced with new estimated feature positions given by correcting the current estimated feature positions by values according to the differences. After that, until the differences between the initial estimated feature positions and the comparison feature positions, i.e. the differences between the current estimated feature positions and the real feature positions, become at or below the permissible limit, the calculating of image information, the calculating of image information, the calculating of comparison feature positions, and the correcting and updating of the current estimated feature positions are repeated. And when the differences between the initial estimated feature positions and comparison feature positions become at or below the permissible limit, the current estimated feature positions are taken as the real feature positions.

Therefore, according to the position detecting method of this invention, even when cross-talks are present between a plurality of features in an image formed on the image plane, the real positions of the plurality of features can be detected accurately.

In the position detecting method of this invention, the predetermined optical system may include a micro-lens array in which lens elements are arranged in a matrix.

Moreover, in the position detecting method of this invention, the specific algorism may be one of a center-of-gravity method and correlation method.

Yet further, in the position detecting method of this invention, the feature may be a spot.

According to a second aspect of the present invention, there is provided an optical characteristic measuring method with which to measure an optical characteristic of an optical system to be examined, the optical characteristic measuring method comprising dividing a wave front of light which has passed through the optical system to be examined, by a predetermined optical system to form an image having a plurality of features; picking up the image having the plurality of features; detecting positions of the plurality of features in the image using the position detecting method according to this invention; and calculating an optical characteristic of the optical system to be examined based on the detected positions of the plurality of features.

According to this, the positions of the plurality of features in the image formed on the image plane are accurately detected using the position detecting method according to this invention. Based on the detected positions of the plurality of features, the optical characteristic of the optical system to be examined is calculated. Accordingly, the optical characteristic of the optical system can be very accurately measured.

In the optical characteristic measuring method according to this invention, the optical characteristic may be wave-front aberration.

According to a third aspect of the present invention, there is provided an optical characteristic measuring unit which measures an optical characteristic of an optical system to be examined, the optical characteristic measuring unit comprising a wave-front dividing device which is arranged on an optical path of light passing through the optical system to be examined, divides a wave front of the light passing through the optical system to be examined, and forms an image having a plurality of features; a pick-up unit which is arranged a predetermined distance apart from the wave-front dividing device and picks up the image having the plurality of features; a position detecting unit connected to the pick-up unit, which detects positions of the plurality of features in the image using the position detecting method according to this invention with the wave-front dividing device as the predetermined optical system; and an optical characteristic calculating unit connected to the position detecting unit, which calculates an optical characteristic of the optical system to be examined based on the detected positions of the plurality of features.

According to this, a pick-up unit picks up an image having a plurality of features that is formed through a wave-front dividing device. Subsequently, a position detecting unit using the position detecting method of this invention accurately detects the positions of the plurality of features from the pick-up result. And an optical characteristic calculating unit calculates the optical characteristic of the optical system to be examined based on the detected positions of the plurality of features. That is, the optical characteristic measuring unit of this invention measures the optical characteristic of the optical system to be examined using the optical characteristic measuring method of this invention, so that the optical characteristic of the optical system can be accurately measured.

In the optical characteristic measuring unit according to this invention, the wave-front dividing device may be a micro-lens array in which lens elements are arranged in a matrix.

Moreover, in the optical characteristic measuring unit according to this invention, the optical system to be examined may be a projection optical system that transfers a pattern formed on a mask onto a substrate.

Here, a housing that houses the wave-front dividing device and the pick-up unit may be attached to a stage that holds the substrate.

According to a fourth aspect of the present invention, there is provided an exposure apparatus which, by illuminating a substrate with exposure light, transfers a predetermined pattern onto a substrate, comprising an exposure apparatus main body which comprises a projection optical system arranged on an optical path of the exposure light; and an optical characteristic measuring unit according to this invention with the projection optical system as the optical system to be examined.

According to this, a given pattern is transferred on a substrate by a projection optical system of which the optical characteristic has been measured accurately by the optical characteristic measuring unit of this invention and adjusted suitably. Therefore, the given pattern can be very accurately transferred on the substrate.

In the exposure apparatus according to this invention, the optical characteristic measuring unit may be attachable to and detachable from the exposure apparatus main body.

According to a fifth aspect of the present invention, there is provided a device manufacturing method including a lithography process, wherein in the lithography process, an exposure apparatus according to this invention performs exposure. According to this, because the exposure apparatus of this invention can very accurately transfer a given pattern onto divided areas, productivity in manufacturing highly integrated devices having a fine circuit pattern can be improved.

BRIEF DESCRIPTION OF THE DRAWINGS

In the accompanying drawings:

FIG. 3 is a view for explaining the surface state of a mark plate in FIG. 2;

DETAILED DESCRIPTION OF THE PREFERRED EMBODIMENTS

An embodiment of the present invention will be described below with reference to FIGS. 1 to 12.

Figure 1:
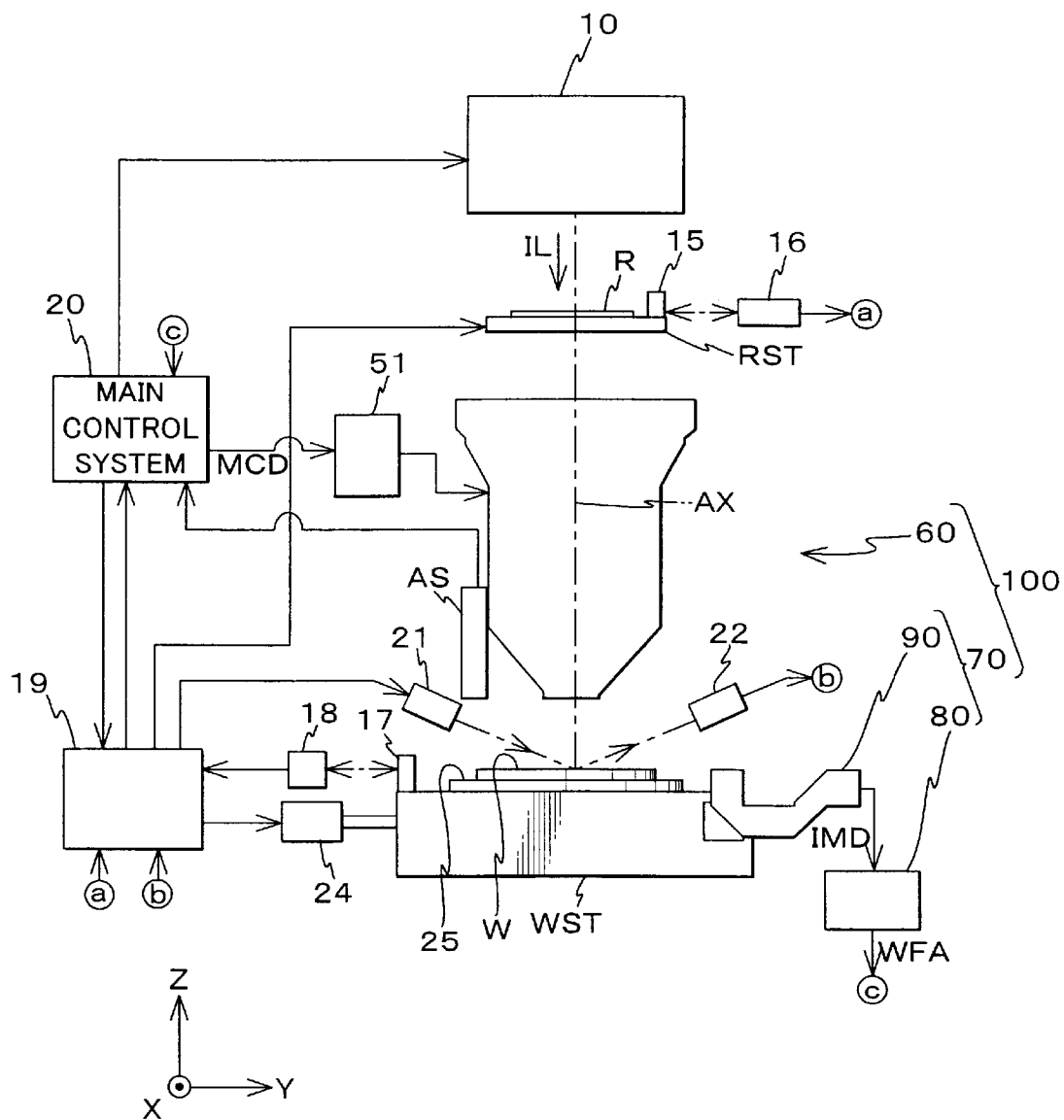
FIG. 1 is a schematic view showing the construction and arrangement of an exposure apparatus according to an embodiment.

FIG. 1 shows the schematic construction and arrangement of an exposure apparatus 100 according to this embodiment, which is a projection exposure apparatus of a step-and-scan type. This exposure apparatus 100 comprises an exposure-apparatus main body 60 and a wave front-aberration measuring unit 70 as a unit for measuring an optical characteristic.

The exposure-apparatus main body 60 comprises an illumination system 10, a reticle stage RST for holding a reticle R, a projection optical system PL as an optical system to be examined, a wafer stage WST on which a wafer W as a substrate is mounted, an alignment detection system AS, a stage control system 19 for controlling the positions and yaws of the reticle stage RST and the wafer stage WST, a main control system 20 to control the whole apparatus overall and the like.

The illumination system 10 comprises a light source, an illuminance-uniformalizing optical system including a fly-eye lens and the like, a relay lens, a variable ND filter, a reticle blind, a dichroic mirror, and the like (none are shown). The construction of such an illumination system is disclosed in, for example, Japanese Patent Laid-Open No. 10-112433 and U.S. Pat. No. 6,308,013 corresponding thereto. The disclosure in the above Japanese Patent Laid-Open and U.S. Patent is incorporated herein by reference as long as the national laws in designated states or elected states, to which this international application is applied, permit. The illumination system 10 illuminates a slit-like illumination area defined by the reticle blind BL on the reticle R having a circuit pattern thereon with exposure light IL having almost uniform illuminance.

On the reticle stage RST, a reticle R is fixed by, e.g., vacuum chuck. The reticle stage RST can be finely driven on an X-Y plane perpendicular to the optical axis (coinciding with the optical axis AX of a projection optical system PL) of the illumination system 10 by a reticle-stage-driving portion (not shown) constituted by a magnetic-levitation-type, two-dimensional linear actuator in order to position the reticle R, and can be driven at specified scanning speed in a predetermined scanning direction (herein, parallel to a Y-direction). Furthermore, in the present embodiment, because the magnetic-levitation-type, two-dimensional linear actuator comprises a Z-driving coil as well as a X-driving coil and a Y-driving coil, the reticle stage RST can be driven in a Z-direction.

The position of the reticle stage RST in the plane where the stage moves is always detected through a movable mirror 15 by a reticle laser interferometer 16 (hereinafter, referred to as a "reticle interferometer") with resolving power of, e.g., 0.5 to 1 nm. The positional information of the reticle stage RST is sent from the reticle interferometer 16 through the stage control system 19 to the main control system 20, and the main control system 20 drives the reticle stage RST via the stage control system 19 and the reticle-stage-driving portion (not shown) based on the positional information of the reticle stage RST.

The projection optical system PL is arranged underneath the reticle stage RST in FIG. 1, whose optical axis AX is parallel to be the Z-axis direction, and is, for example, a reduction optical system that is telecentric bilaterally and that comprises a plurality of lens elements (not shown) whose optical axis AX is parallel to the Z-axis. Moreover, the projection optical system PL has a predetermined reduction ratio $\beta$ of, e.g. ¼, ⅕, or ⅙. Therefore, when the illumination area of the reticle R is illuminated with the exposure illumination light IL, the image reduced to the reduction ratio $\beta$ times the size of the circuit pattern's part in the illumination area on the reticle R is projected and transferred onto a slit-like exposure area of the wafer W coated with a resist (photosensitive material) via the projection optical system PL, the reduced image being a partially inverted image.

It is noted that in this embodiment, specific lens elements, e.g. predetermined five lens elements, of the plurality of lens elements are movable independently of each other. The movement of each of such specific lens elements is performed by three driving devices such as piezo devices, provided on the lens element, which support a lens-supporting member supporting the lens element and which connect the lens element to the lens barrel. That is, the specific lens elements can be moved independently of each other and parallel to the optical axis AX by the displacement of driving devices and can be tilted at a given angle to a plane perpendicular to the optical axis AX. And an imaging-characteristic correcting controller 51 controls drive signals applied to the driving devices according to an instruction MCD from the main control system 20, which signals control the respective displacement amounts of the driving devices.

In the projection optical system PL having the above construction, the main control system 20, by controlling the movement of the lens elements via the imaging-characteristic correcting controller 51, adjusts the optical characteristics such as distortion, field curvature, astigmatism, coma and spherical aberration.

The wafer stage WST is arranged on a base (not shown) below the projection optical system in FIG. 1, and on the wafer stage WST a wafer holder 25 is disposed on which a wafer W is fixed by, e.g., vacuum chuck. The wafer holder 25 is constructed to be able to be tilted in any direction with respect to a plane perpendicular to the optical axis of the projection optical system PL and to be able to be finely moved in the direction of the optical axis AX (the Z-direction) of the projection optical system PL by a driving portion (not shown). The wafer holder 25 can also rotate finely about the optical axis AX.

Furthermore, on the side in the +Y direction of the wafer stage WST, a bracket structure is formed to which a wave front sensor 90 described later is attachable.

The wafer stage WST is constructed to be able to move not only in the scanning direction (the Y-direction) but also in a direction perpendicular to the scanning direction (the X-direction) so that a plurality of shot areas on the wafer can be positioned at an exposure area conjugated to the illumination area. And the wafer stage WST is driven in the X- and Y-directions by a wafer-stage driving portion 24 comprising a motor, etc.

The position of the wafer stage WST in the X-Y plane is always detected through a movable mirror 17 by a wafer laser interferometer with resolving power of, e.g., 0.5 to 1 nm. The positional information (or velocity information) of the wafer stage WST is sent through the stage control system 19 to the main control system 20, and based on the positional information (or velocity information), the main control system 20 controls the movement of the wafer stage WST via the stage control system 19 and wafer-stage driving portion 24.

In this embodiment, the alignment detection system AS is a microscope of an off-axis type which is provided on the side face of the projection optical system PL and which comprises an imaging-alignment sensor observing street-lines and position detection marks (fine-alignment marks) formed on the wafer. The construction of such an alignment detection system is disclosed in detail in, for example, Japanese Patent Laid-Open No. 9-219354 and U.S. Pat. No. 5,859,707 corresponding thereto. The disclosure in the above Japanese Patent Laid-Open and U.S. Patent is incorporated herein by reference as long as the national laws in designated states or elected states, to which this international application is applied, permit. The alignment detection system AS supplies observation results to the main control system 20.

Furthermore, in the apparatus of FIG. 1, a multi-focus-position detection system (21, 22) is provided which detects positions in the Z-direction (optical axis direction) of areas within and around the exposure area of the surface of the wafer W and which is a focus detection system of an oblique-incidence type. The multi-focal detection system (21, 22) comprises a illumination optical system 21 composed of a bundle of optical fibers, a condenser lens, a pattern forming plate, a lens, a mirror, and an illumination objective lens (none are shown) and a light-receiving optical system 22 composed of a focusing objective lens, a rotationally-vibrating plate, an imaging lens, a slits-plate for receiving light, and a detector having a plurality of photo-sensors (none are shown). The construction of such a multi-focal detection system is disclosed in detail in, for example, Japanese Patent Laid-Open No. 6-283403 and U.S. Pat. No. 5,448,332 corresponding thereto. The disclosure in the above Japanese Patent Laid-Open and U.S. Patent is incorporated herein by reference as long as the national laws in designated states or elected states, to which this international application is applied, permit. The multi-focal detection system (21, 22) supplies detection results to the stage control system 19.

The wave-front-aberration measuring unit 70 comprises a wave-front sensor 90 and a wave-front-data processing unit 80.

Figure 2:
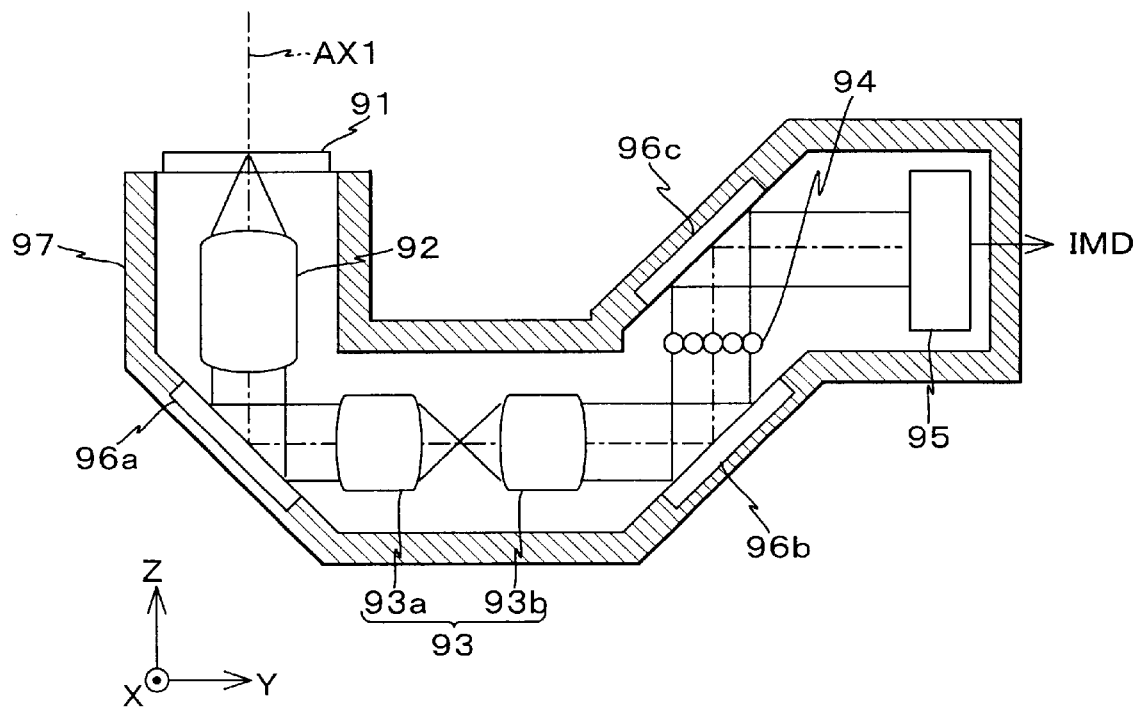
FIG. 2 is a schematic view showing the construction of a wave front sensor in FIG. 1.

The wave-front sensor 90, as shown in FIG. 2, comprises a mark plate 91, a collimator lens 92, a relay lens system 93 composed of lenses 93a and 93b, a micro-lens array 94 as a device for dividing wave-fronts, and a CCD 95 as an image-picking-up unit, which are arranged sequentially in that order on the optical axis AXJ. Moreover, the wave-front sensor 90 further comprises mirrors 96a, 96b, 96c for setting the optical path of light incident on the wave-front sensor 90, and a housing member 97 housing the collimator lens 92, the relay lens system 93, the micro-lens array 94, the CCD 95 and the mirrors 96a, 96b, 96c.

The mark plate 91 is made using a glass substrate as the substrate and is disposed such that the position in the Z-direction thereof is the same as the surface of the wafer W fixed on the wafer holder 25 while the surface thereof is perpendicular to the direction parallel to the optical axis AX1 (refer to FIG. 1). An opening 91a is made in the center of the mark plate 91 as shown in FIG. 3. Furthermore, formed around the opening 91a on the surface of the mark plate 91 are more than two, four in FIG. 3, two-dimensional position-detection marks 91b. In this embodiment, the two-dimensional position-detection mark 91b comprises a line-and-space mark 91c having lines extending in the X-direction and a line-and-space mark 91d having lines extending in the Y-direction. It is remarked that the line-and-space marks 91c, 91d can be observed by the above alignment detection system AS. Moreover, the other part of the surface of the mark plate 91 than the opening 91a and the two-dimensional position-detection mark 91b is made reflective by, for example, depositing chrome (Cr) on the glass substrate.

Referring back to FIG. 2, the collimator lens 92 produces parallel rays of light from light incident through the opening 91a.

Figure 4A:
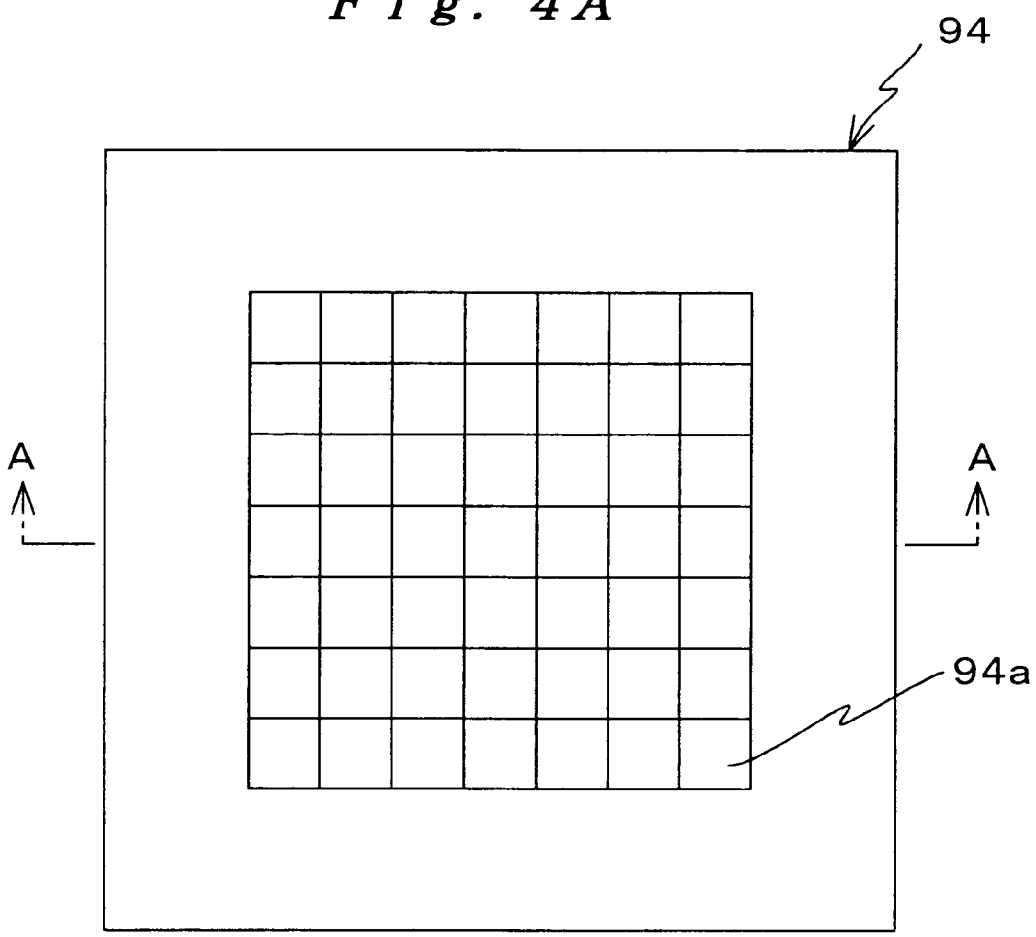
FIGS. 4A and 4B are views for explaining the construction of a micro lens array in FIG. 2.
Figure 4B:
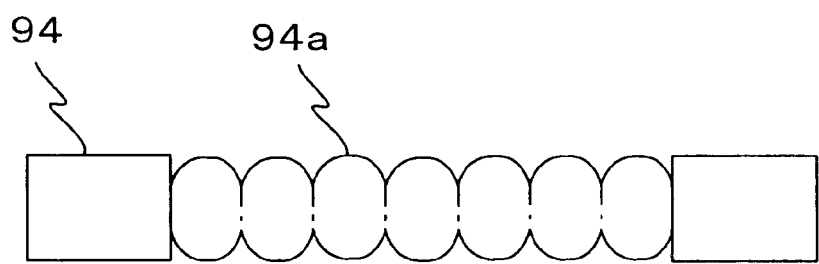

The micro-lens array 94, as shown in FIGS. 4A and 4B, has a lot of micro lenses 94a having a positive refractive power, which are square in the plan view, which are arranged in a matrix arrangement and adjacent to each other, and whose optical axes are substantially parallel to each other. It is remarked that FIGS. 4A and 4B show micro lenses 94a arranged in matrix with 7 rows and 7 columns as an example. The micro lenses 94a may be rectangle in the plan view, not being limited to the square, or all may not have the same shape. Moreover, in the micro-lens array 94 the micro lenses 94a may be arranged with uneven pitches or obliquely.

The micro-lens array 94 is made by etching a plane parallel plate, and each micro lens 94a of the micro-lens array 94 focuses rays of light incident through the relay lens system 93 and forms the image in the opening 91a in a respective position.

The optical system comprising the collimator lens 92, the relay lens system 93, the micro-lens array 94 and the mirrors 96a, 96b, 96c is called a wave-front-aberration measuring optical system, hereinafter.

Referring back to FIG. 2, the CCD 95 is disposed a predetermined distance apart from the micro-lens array 94, specifically on an image plane on which pinhole images, described later, are formed by the micro lenses 94a, the pinhole images being ones of a pinhole image formed on the opening 91a. That is, the CCD 95 has a light-receiving plane conjugate to the plane where the opening 91a of the wave-front-aberration measuring optical system is made, and picks up the lot of pinhole images formed on the light-receiving plane. The pick-up result as pick-up data IMD is supplied to the wave-front-data processing unit 80.

The housing member 97 has supporting members (not shown) for supporting the collimator lens 92, the relay lens system 93, the micro-lens array 94 and the CCD 95 respectively. It is remarked that the reflection mirrors 96a, 96b, 96c are fixed to the inner surface of the housing member 97. Furthermore, the housing member 97 has such an outer shape that it is fitted into the bracket structure of the wafer stage WST and is attachable to and detachable from the wafer stage WST.

Figure 5:
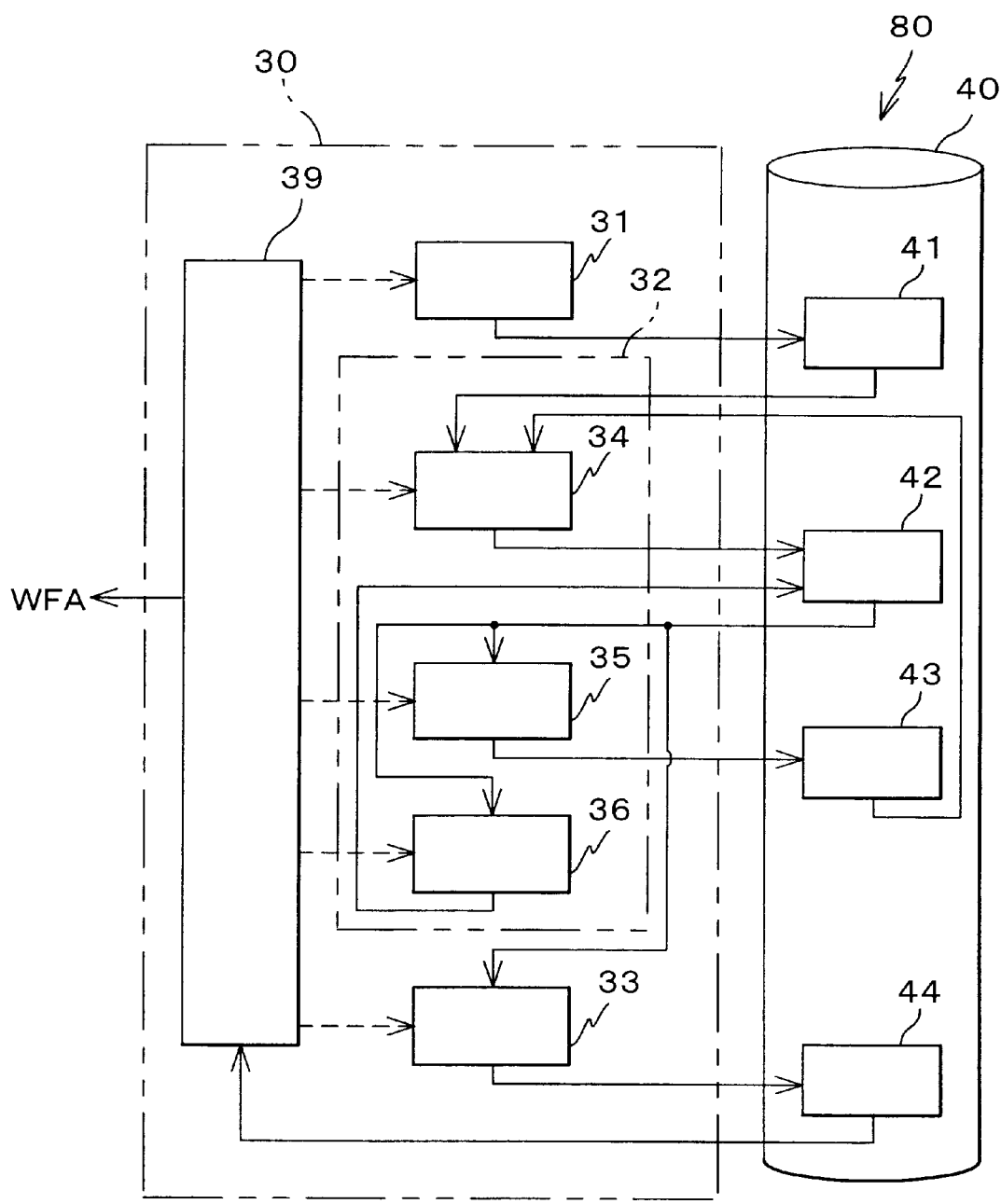
FIG. 5 is a block diagram showing the construction of a main control system in FIG. 1.

The wave-front-data processing unit 80 comprises a main controller 30 and a storage unit 40 as shown in FIG. 5. The main controller 30 comprises (a) a controller 39 for controlling the overall action of the wave-front-data processing unit 80 and supplying wave-front measurement result data WFA to the main control system 20, (b) a pick-up data collecting unit 31 for collecting pick-up data IMD from the wave-front sensor 90, (c) a position-detecting unit 32 for detecting the positions of spot-images based on the pick-up data and (d) a wave-front-aberration calculating unit 33 for calculating the wave-front aberration of the projection optical system PL.

The position-detecting unit 32 comprises (i) a spot-image position calculating unit 34 for calculating presumptive spot-image position or comparison spot-image position, both described later, based on the pick-up data by using a specific algorism such as a center-of-gravity method or correlation method, (ii) an image-information calculating unit 35 for calculating image-data, based on a model representing the wave-front-aberration measuring optical system, for the case when a spot-image is assumed to be formed in a presumptive spot-image position, and (iii) a judging-updating unit 36 for updating the presumptive spot-image position when, if checking based on the difference between an initial presumptive spot-image position and a comparison spot-image position whether or not a presumptive spot-image position can be adopted as a corresponding spot-image position, the answer is NO.

In addition, the storage unit 40 comprises (a) a pick-up data storing area 41 for storing pick-up data, (b) a position data storing area 42 for storing presumptive spot-image position data and comparison spot-image position data, (c) a calculated-image-data storing area 43 for storing image-information calculated, and (d) a wave-front-aberration-data storing area 44 for storing wave-front-aberration data.

While, in this embodiment, the main controller 30 comprises the various units as described above, the main controller 30 may be a computer system where the functions of the various units are implemented as program modules installed therein.

Next, the exposure operation of the exposure apparatus 100 of this embodiment will be described with reference to a flow chart in FIG. 6 and other figures as needed.

As a premise of the operation it is assumed that the wave-front sensor 90 is mounted on the wafer stage WST and that the wave-front-data processing unit 80 is connected to the main control system 20.

Moreover, it is assumed that the positional relation between the opening 91a of the mark plate 91 of the wave-front sensor 90 fixed to the wafer stage and the wafer stage WST has been measured by observing the two-dimensional position-detection marks 91b through the alignment detection system AS. That is, the assumption is that the X-Y position of the opening 91a can be accurately detected based on position information (or speed information) from a wafer interferometer 18, and that by controlling the movement of the wafer stage WST via the wafer-stage driving portion 24, the opening 91a can be accurately positioned at a desired X-Y position. In this embodiment, the positional relation between the opening 91a and the wafer stage WST is accurately detected, based on detection result of the positions of the four two-dimensional position-detection marks 91b through the alignment detection system AS, using a statistical method such as EGA (Enhanced Global Alignment) disclosed in, for example, Japanese Patent Laid-Open No. 61-44429 and U.S. Pat. No. 4,780,617 corresponding thereto. The disclosure in the above Japanese Patent Laid-Open and U.S. Patent is incorporated herein by reference as long as the national laws in designated states or elected states, to which this international application is applied, permit.

Figure 6:
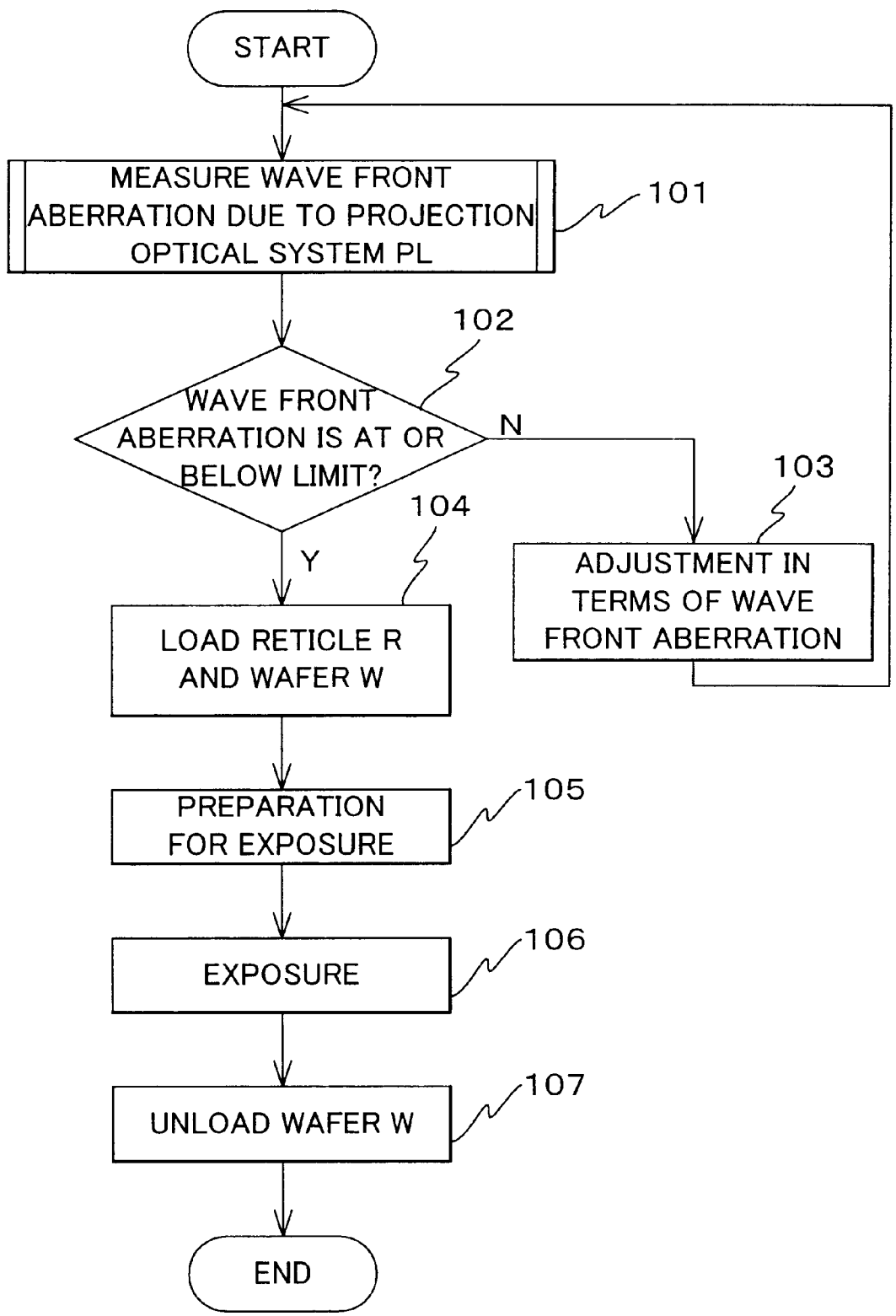
FIG. 6 is a flow chart for explaining the exposure process by the apparatus of FIG. 1.
Figure 7:
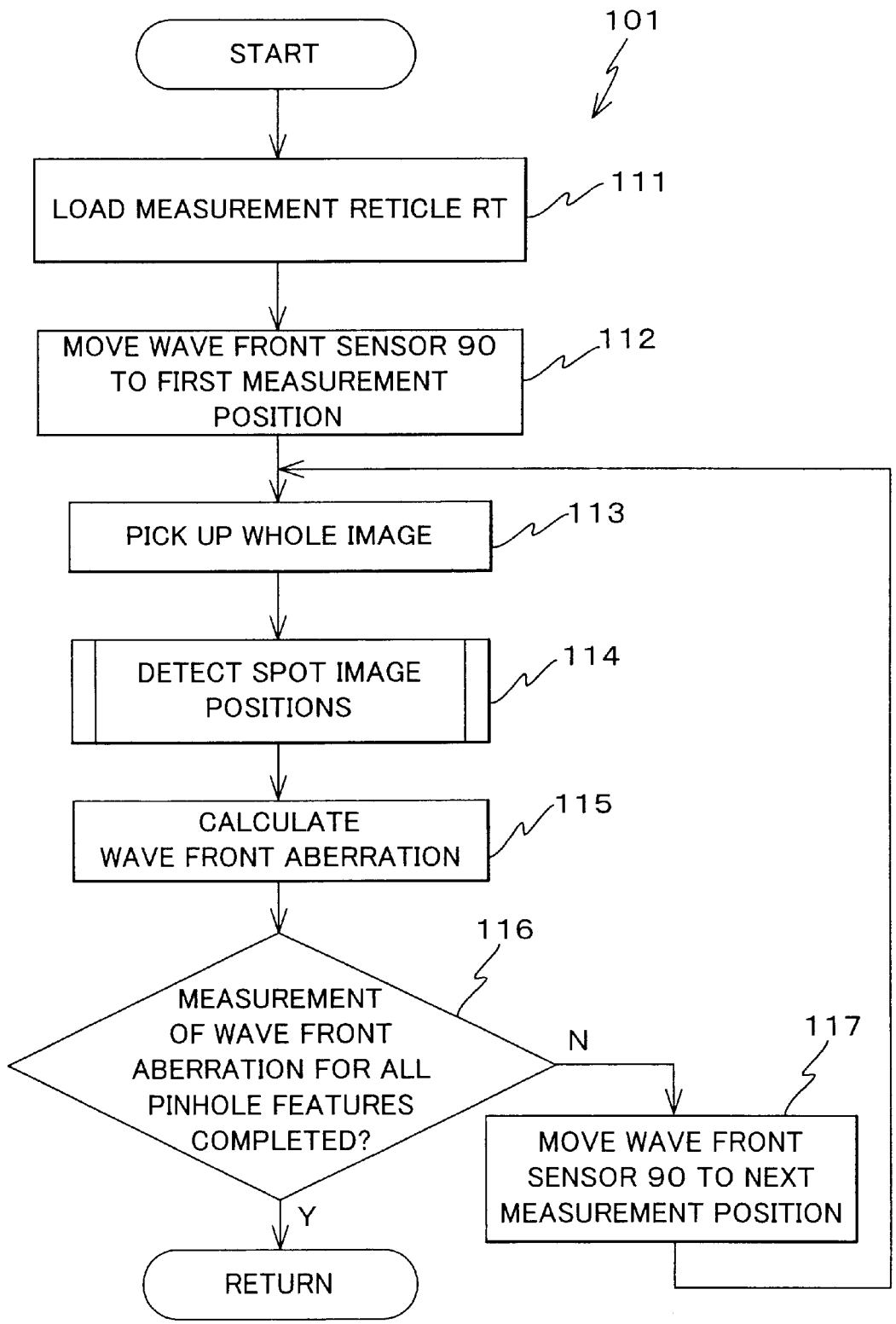
FIG. 7 is a flow chart for explaining the process in an aberration measuring subroutine of FIG. 6.
Figure 8:
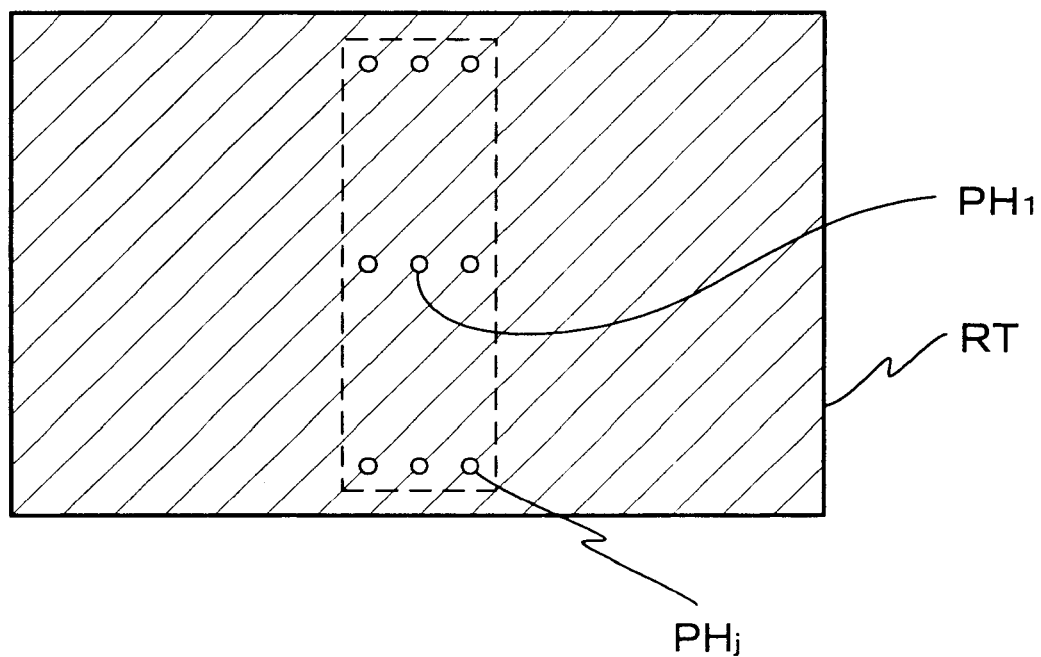
FIG. 8 is a view showing an exemplary measurement pattern formed on a measurement reticle.

In the process shown in FIG. 6, first in a subroutine 101, the wave-front aberration of the projection optical system PL is measured. In a step 111 of the measuring of the wave-front aberration, as shown in FIG. 7, a reticle loader (not shown) loads a measurement reticle RT, shown in FIG. 8, for measuring the wave-front aberration onto the reticle stage RST. FIG. 8 shows the measurement reticle RT on which a plurality of pinhole-like features $PH_1$ through $PH_N$, N=9 in FIG. 8, are formed in a matrix arrangement, whose rows are parallel to the Y-direction and whose columns are parallel to the X-direction. It is noted that the pinhole-like features $PH_1$ through $PH_N$ are formed within an area having the size of the slit-like illumination area, which is enclosed by dashed lines in FIG. 8.

Subsequently, reticle alignment using a reference mark plate (not shown) fixed on the wafer stage WST and measurement of base-line amount through the alignment detection system AS are performed. And the reticle stage RST is moved for measuring the wave-front aberration such that the first pinhole-like feature $PH_1$ is positioned on the optical axis AX of the projection optical system PL, which movement the main control system 20 controls via the stage control system 19 and the reticle-stage driving portion based on position information (or speed information) of the reticle stage RST from the reticle interferometer 16.

Referring back to FIG. 7, in a step 112 the wafer stage WST is moved so that the opening 91a of the mark plate 91 of the wave-front sensor 90 is positioned at a position conjugate to the pinhole-like feature PH, with respect to the projection optical system PL, which position is on the optical axis AX. The main control system 20 controls such movement via the stage control system 19 and the wafer-stage driving portion 24 based on position information (or speed information) of the wafer stage WST from a wafer interferometer 18. The main control system 20 drives the wafer stage WST finely in the Z-direction via the wafer-stage driving portion 24 based on the detection result from the multi-focal detection system (21, 22) so that the image plane on which the pinhole-like feature PH, is imaged coincides with the upper surface of the mark plate 91 of the wave-front sensor 90.

Figure 9:
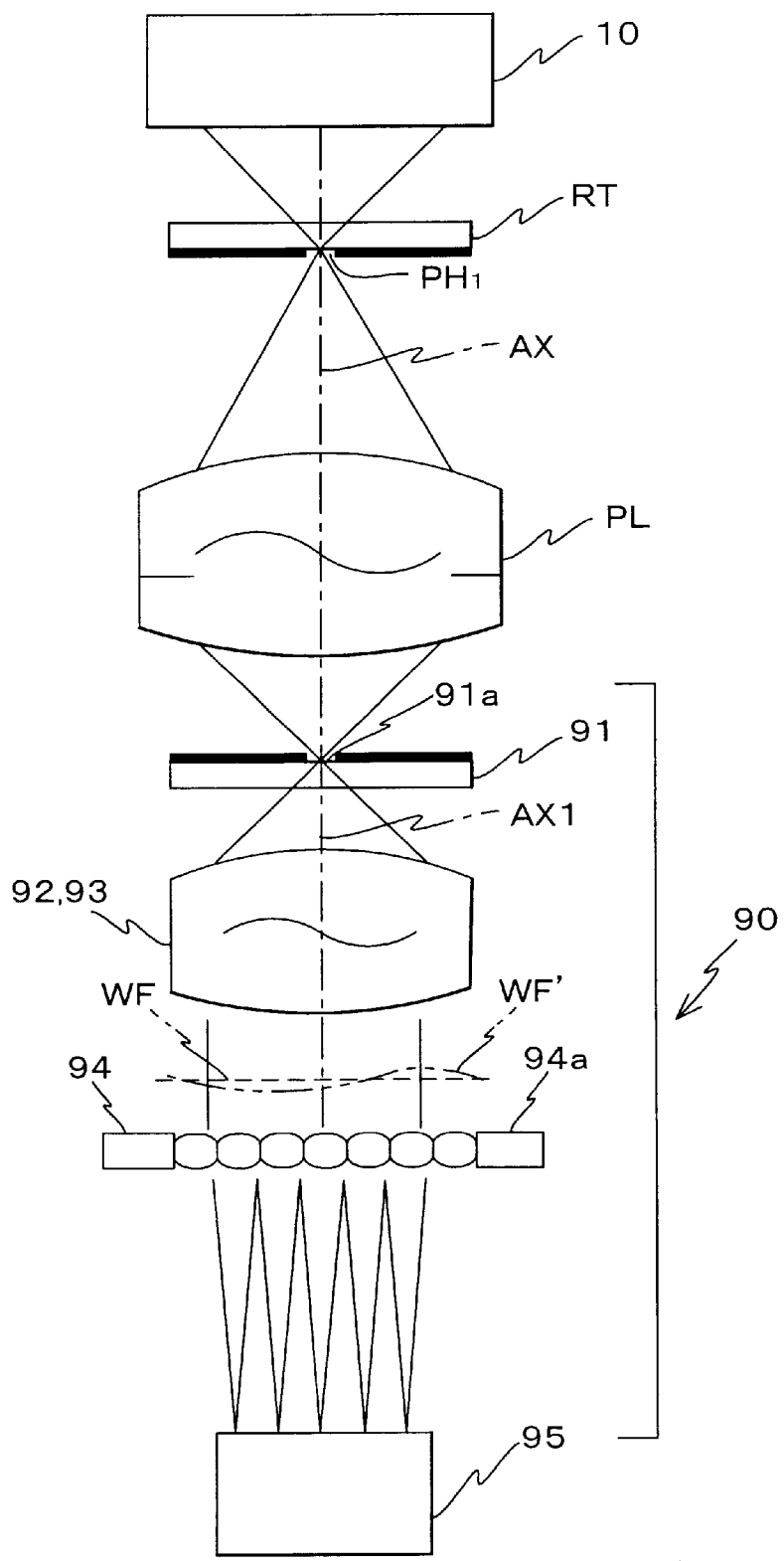
FIG. 9 is a view for explaining an optical arrangement in measuring wave front aberration.

By this, positioning of components for measuring the wave-front aberration using a spherical wave from the first pinhole-like feature PH, is completed. FIG. 9 shows the optical arrangement of the components with centering the optical axis AX1 of the wave-front sensor 90 and the optical axis AX of the projection optical system PL in the drawing.

In this optical arrangement, the illumination light IL from the illumination system 10 reaches the first pinhole-like feature $PH_1$ on the measurement reticle RT, which sends out the light being a spherical wave. The spherical wave is focused on the opening 91a of the mark plate 91 of the wave-front sensor 90 through the projection optical system PL. It is remarked that light passing through the pinhole-like features $PH_2$ through $PH_N$ other than the first pinhole-like feature PH, do not reach the opening 91a. The wave front of the light focused on the opening 91a is almost spherical with wave-front aberration due to the projection optical system PL.

It is noted that the measurement result of the wave-front of light may include components due to position deviation of the upper surface of the mark plate 91 of the wave-front sensor 90 from the image plane of the projection optical system $PL_1$ on which a pinhole image of the pinhole-like feature PH, is formed, as well as the wave-front aberration due to the projection optical system PL, which components are caused by tilt, position deviation in the optical-axis direction and so forth. Therefore, the position of the wafer stage WST is controlled based on the deviation components calculated based on wave-front-aberration data obtained by the wave-front-aberration measuring unit 70, so that very accurate wave-front-aberration measurement is possible.

The collimator lens 92 produces from the light having passed through the opening 91a parallel rays of light, which is made incident on the micro-lens array 94 via the relay lens system 93. Here, the wave-front of the light incident on the micro-lens array 94 has wave-front aberration due to the projection optical system PL. That is, while if the projection optical system PL does not cause wave-front aberration, the wave-front WF is, as shown by a dashed line in FIG. 9, a plane perpendicular to the optical axis AX1, if the projection optical system PL causes wave-front aberration, the wave-front WF' varies in angle relative to the plane according to position as shown by a two-dot chain line in FIG. 9.

In the micro-lens array 94, each micro lens 94a images the image of the pinhole-like feature $PH_1$ on the opening 91a on the pick-up plane of CCD 95 conjugate to the mark plate 91. If the wave-front of the light incident on the micro lens 94a is perpendicular to the optical axis AX1, the spot-image centered at the intersection point between the optical axis of the micro lens 94a and the image plane is formed on the image plane. If the wave-front of the light incident on the micro lens 94a is oblique to the optical axis AX1, the spot-image centered at a point a distance apart from the intersection point between the optical axis of the micro lens 94a and the image plane is formed on the image plane, the distance varying according to the angle of the line tangent to the wave-front.

Figure 10:
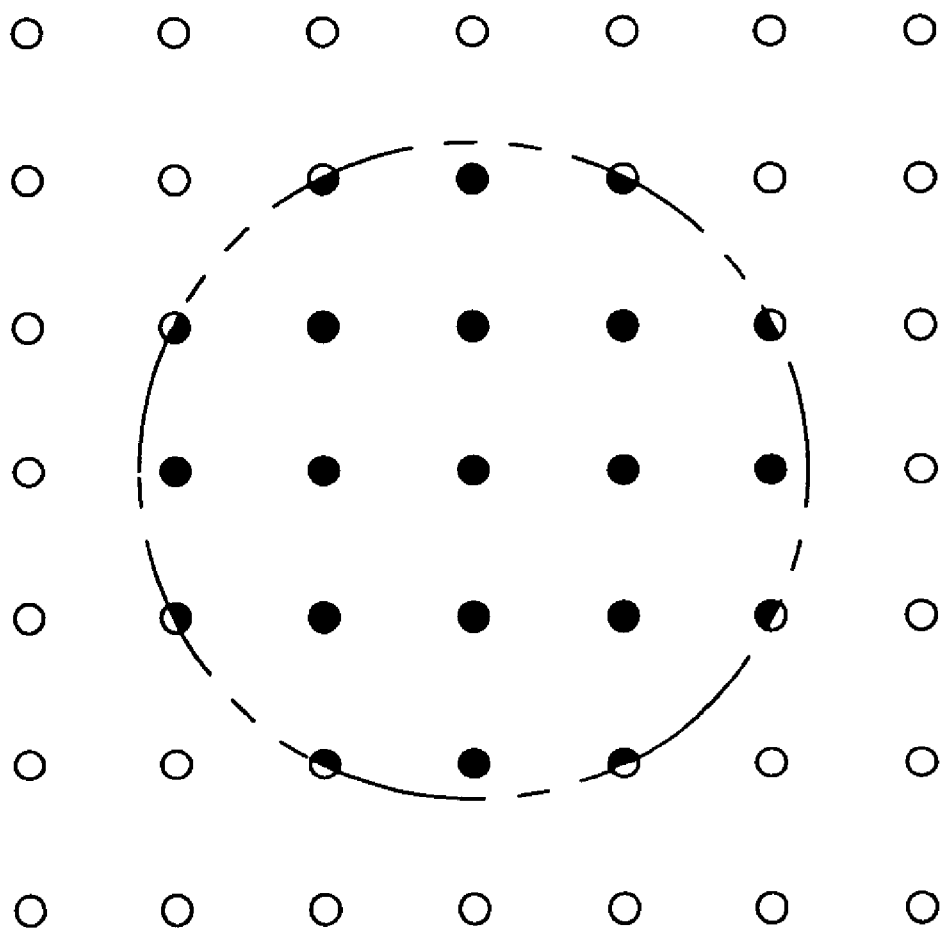
FIG. 10 is a view for explaining an image formed on the pick-up plane of a CCD in FIG. 9.

FIG. 10 shows the positions of a plurality of such spot-images as an example. In FIG. 10, a two-dot chain line indicates an area corresponding to the pupil of the projection optical system PL (hereinafter, also called a "pupil area"). Furthermore, in FIG. 10, filled circles indicate the positions of spot-images actually formed on the image plane, and empty circles indicate intersection points between the image plane and the optical axes of micro lenses 94a that light is not incident on, forming no image.

Referring back to FIG. 7, in a step 113 the CCD 95 picks up an image formed on the image plane, from which pick-up data IMD is obtained and supplied to the wave-front-data processing unit 80. In the wave-front-data processing unit 80, the pick-up data collecting unit 31 collects the pick-up data IMD and stores in the pick-up data storing area 41.

Next, in a subroutine 114, the position of each spot-image is detected based on the pick-up result.

Here, the outline of the principle of detecting the positions of spot-images, which is performed in the below, will be described with reference to FIGS. 11A and 11B, taking spot-images distributed in one dimension (the X-direction) as an example for the sake of making the description simple.

Figure 11A:
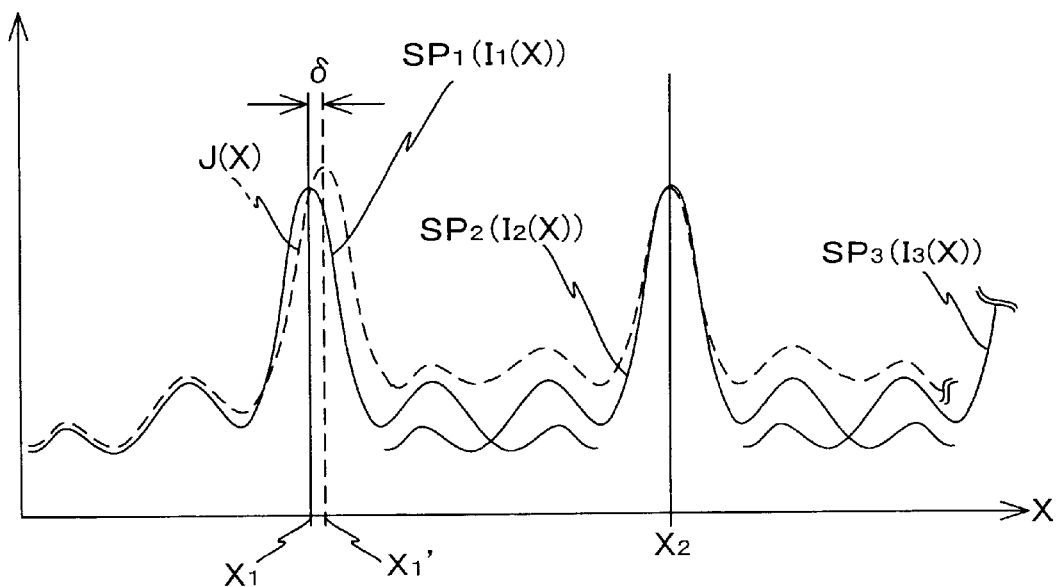
FIGS. 11A and 11B are views for explaining the principle of detecting spot-image positions.

As indicated by solid curves in FIG. 11A, spot-images $SP_j$ having almost the same shape and light intensity distribution of $I_j(X)$ $(=|A_j(X)|^2$, where $A_j(X)$ represents a complex amplitude and j=1, 2, . . . ) are formed by the micro lenses 94a, which are spaced almost the same distance apart from each other. Here, a spot-image $SP_1$ is located on the end of the area corresponding to the pupil area in the −X direction, and no spot-image is present further in the −X direction than the spot-image $SP_1$. Meanwhile, a spot-image $SP_2$ is located on the side in the +X direction of the spot-image $SP_1$, and a spot-image $SP_3$ is located on the side in the +X direction of the spot-image $SP_2$. Further, a spot-image $SP_4$ (not shown) is located on the side in the +X direction of the spot-image $SP_3$.

It is noted that because all the spot-images $SP_j$ are formed upon picking up, the light intensity distribution $J(X)$ on the image plane is given by the equation (1)

$$J(X)=|A_1(X)+A_2(X)+\ldots|^2 \tag{1}$$

and denoted by a broken curve in FIG. 11A, the light intensity distribution being called an "intensity distribution" hereinafter. The intensity distribution $I_j(X)$ is approximated by a SYNC function and tails over a relatively long range.

Therefore, the intensity distribution $J(X)$ around a position $X_j$ (hereinafter, called "spot-image position $X_j$") takes on a shape similar to the intensity distribution $I_j(X)$ $(=|A_j(X)|^2)$ of the spot-image $SP_j$ with influence of other spot-images, that is, cross-talk. The shorter the distance between spot-images is, the larger such influence becomes, and most of the influence is due to two neighboring spot-images $SP_{j-1}$, $SP_{j+1}$. In view of two neighboring spot-images $SP_j$ and $SP_{j+1}$, the peak positions of the two seem to draw each other in the waveform of the intensity distribution $J(X)$, so that the peak positions or centers of gravity vary. The amount of such variation in a peak position or center-of-gravity is called "cross-talk amount" hereinafter.

In such a case, when there are spot-images symmetrically present on the opposite sides of a spot-image as in the case of the spot-images $SP_2$ and $SP_3$, the cross-talk amounts of the spot-image from the neighboring spot-images cancel each other, and therefore, the spot-image position can be accurately estimated even using an algorism such as a center-of-gravity method or correlation method for detecting spot-image positions based on the local intensity distribution.

Meanwhile, when there is a spot-image present only on one side of a spot-image as in the case of the spot-image $SP_1$, the cross-talk amount of the spot-image from the neighboring spot-image remains, and a spot-image position estimated using an algorism for detecting spot-image positions based on the local intensity distribution of $J(X)$ is one shifted toward the neighboring spot-image. Such an estimation error of a spot-image position due to remaining cross-talk always occurs when there is a relatively large wave-front aberration present or the neighboring spot-images are not symmetrical relative to a spot-image, such as the case where a neighboring spot-image lies partially within the pupil area, the amount of the error varying with the case.

Figure 11B:
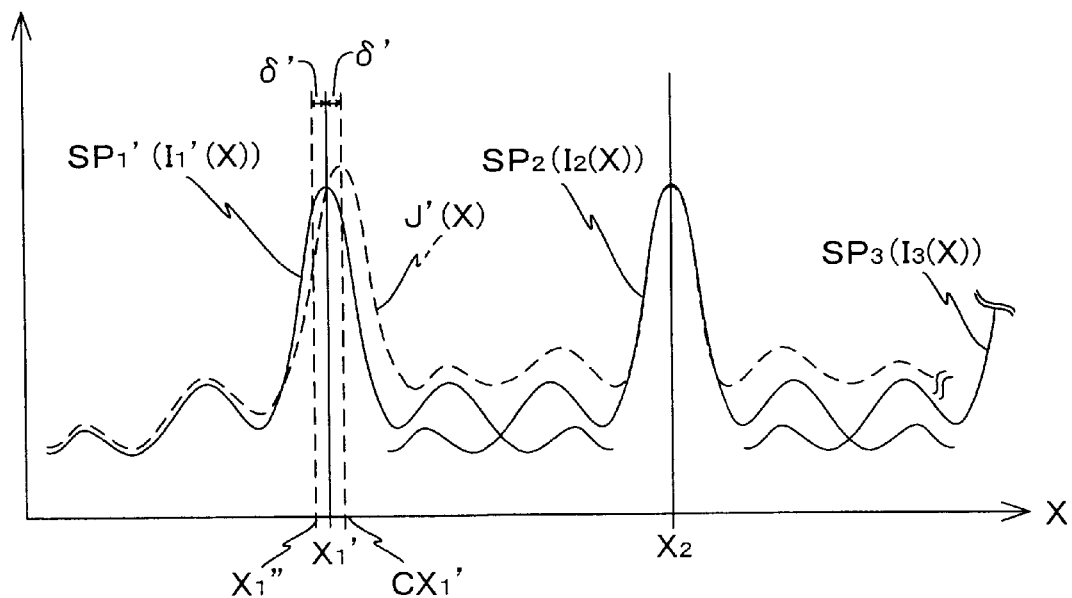

Letting $X_1'$ indicate estimated spot-image position of the spot-image $SP_1$ shifted toward the spot-image $SP_2$ as shown in FIG. 11A, an intensity distribution $J'(X)$ as shown in FIG. 11B is calculated assuming the estimated spot-image position $X_1'$ to be a real spot-image position. And a spot-image position $CX_1'$ is calculated based on the intensity distribution $J'(X)$ using the algorism (hereinafter, called a "specific algorism") used when obtaining the estimated spot-image position $X_1'$, the spot-image position $CX_1'$ being called a "comparison spot-image position". Here, the difference $\delta'$ $(=CX_1'-X_1')$ between the estimated spot-image position $X_1'$ and the comparison spot-image position $CX_1'$ approximates the difference $\delta$ $(=X_1'-X_1)$ between the real spot-image position $X_1$ and the estimated spot-image position $X_1'$. That is because compared with the difference between the spot-image positions $X_1$ and $X_2$ the difference $\delta$ is very small, and the amounts of the cross-talk of the spot-image $SP_1$ and the spot-image $SP_1'$ from the spot-image $SP_2$ are supposedly at the same level.

Therefore, a new estimated spot-image position $X_1''$ given by the equation (2) is a better estimation for the real spot-image position $X_1$ than the estimated spot-image position $X_1'$, $$X_1''=X_1'-\delta. \tag{2}$$

This approximation can be generally applied to the case where the neighboring spot-images are not symmetrical relative to a spot-image.

Next, an intensity distribution is calculated assuming the new estimated spot-image position $X_1''$ to be a real spot-image position; a new comparison spot-image position is calculated based on the intensity distribution using the specific algorism, and by subtracting from the new estimated spot-image position $X_1''$ the absolute value of the difference between the new estimated spot-image position $X_1''$ and the new comparison spot-image position, a further new estimated spot-image position is calculated. After that, until the accuracy in estimating the real spot-image position $X_1$ falls within a desired range, the calculation of an estimated spot-image position is repeated recursively.

Based on the principle of detecting spot-image positions as described above, the subroutine 114 detects the positions of spot-images using a pick-up result.

Figure 12:
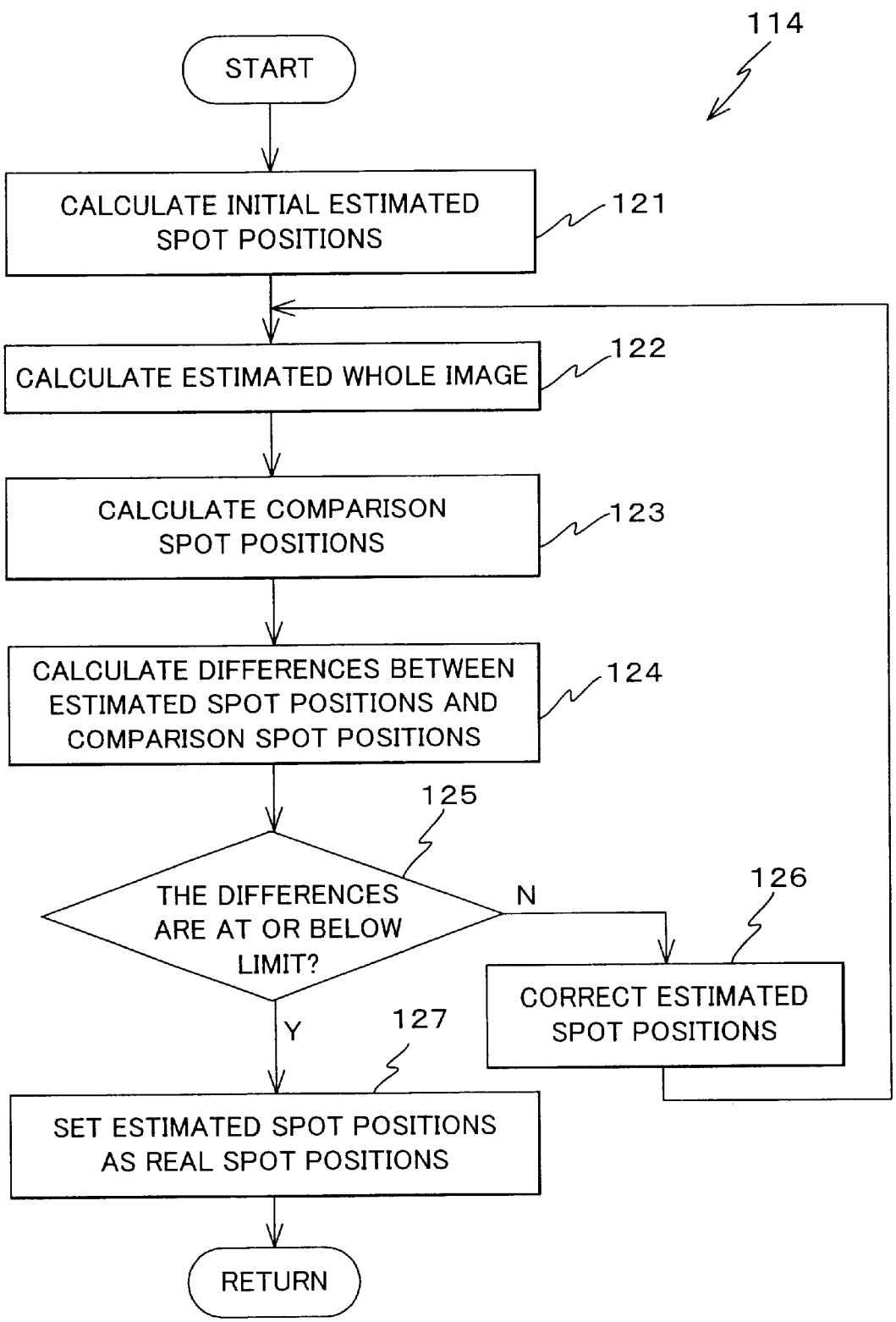
FIG. 12 is a flow chart for explaining the process in a spot-image positions detecting subroutine of FIG. 7.

In a step 121 of the subroutine 114, as shown in FIG. 12, the spot-image position calculating unit 34 reads out pick-up data $J^{(0)}(X, Y)$ (corresponding to the intensity distribution $J(X)$ in FIG. 11A) from the pick-up data storing area 41, calculates initial estimated spot-image positions $P_k^{(0)}[X_k^{(0)}, Y_k^{(0)}]$ (k=1, 2, . . . ) using the specific algorism such as the center-of-gravity method or correlation method, the $P_1^{(0)}$ corresponding to the estimated spot-image position $X_1'$ in FIG. 11A, and stores the initial estimated spot-image positions $P_k^{(0)}[X_k^{(0)}, Y_k^{(0)}]$ in the position data storing area 42.

In the below, let "G" indicate the specific algorism, then the calculation of an estimated spot-image positions P from image data J is expressed by the equation (3)

$$P=G[J]. \tag{3}$$

Using this expression, the calculation of the initial estimated spot-image positions $P_k^{(0)}[X_k^{(0)}, Y_k^{(0)}]$ from the pick-up data $J^{(0)}(X, Y)$ using the specific algorism is expressed by the equation (4)

$$P_k^{(0)}[X_k^{(0)}, Y_k^{(0)}]=G[J^{(0)}(X,Y)]. \tag{4}$$

Next, in a step 122, the image-information calculating unit 35 calculates image data $J^{(1)}(X, Y)$ (corresponding to the intensity distribution $J'(X)$ in FIG. 11B) based on an optical model representing the micro-lens array 94 and the like, which is obtained assuming that the spot-images are formed at the estimated spot-image positions $P_k^{(0)}[X_k^{(0)}, Y_k^{(0)}]$, and stores the image data $J^{(1)}(X, Y)$ in the calculated-image-data storing area 43.

Hereinafter, let "F" indicate an algorism for calculating image data J based on an estimated spot-image positions P, then the calculation of the image data J from the estimated spot-image positions P is expressed by the equation (5)

$$J=F[P]. \tag{5}$$

Using this expression, the calculation of the pick-up data $J^{(1)}(X, Y)$ from the estimated spot-image positions $P_k^{(0)}[X_k^{(0)}, Y_k^{(0)}]$ using the algorism 'F' is expressed by the equation (6)

$$J^{(1)}(X,Y)=F[P_k^{(0)}[X_k^{(0)}, Y_k^{(0)}]]. \tag{6}$$

Subsequently, in a step 123, the spot-image position calculating unit 34 reads out the image data $J^{(1)}(X, Y)$ from the position-information storing area 43, and calculates comparison spot-image positions $CP_k^{(1)}[CX_k^{(1)}, CY_k^{(1)}]$ (corresponding to the comparison spot-image position $CX_1'$ in FIG. 11B) using the equation (7)

$$CP_k^{(1)}[CX_k^{(1)}, CY_k^{(1)}]=G[J^{(1)}(X,Y)], \tag{7}$$

and stores the comparison spot-image positions $CP_k^{(1)}[CX_k^{(1)}, CY_k^{(1)}]$ in the position data storing area 42.

Next, in a step 124, the judging-updating unit 36 reads out the initial estimated spot-image positions $P_k^{(0)}[X_k^{(0)}, Y_k^{(0)}]$ and the comparison spot-image positions $CP_k^{(1)}[CX_k^{(1)}, CY_k^{(1)}]$ and calculates the differences $\Delta X_k^{(1)}, \Delta Y_k^{(1)}$ (k=1, 2, ...) between the initial estimated spot-image positions and the respective comparison spot-image positions using the equations (8) and (9)

$$\Delta X_k^{(1)} = CX_k^{(1)} - X_k^{(0)} \tag{8}$$

$$\Delta Y_k^{(1)} = CY_k^{(1)} - Y_k^{(0)} \tag{9}$$

Subsequently, in a step 125, the judging-updating unit 36 checks whether or not the absolute values of all the differences are at or below a permissible limit $\epsilon$ derived from the wave-front aberration measurement error. While, if the answer is YES, the process proceeds to a step 127, the process proceeds to a step 126 if the answer is NO. At this point of time the answer is NO, and the process proceeds to the step 126.

In the step 126, the judging-updating unit 36 calculates new estimated spot-image positions $P_k^{(1)}[X_k^{(1)}, Y_k^{(1)}]$ using the estimated spot-image positions $P_k^{(0)}[X_k^{(0)}, Y_k^{(0)}]$ and the differences $\Delta X_k^{(1)}, \Delta Y_k^{(1)}$ from the equations (10) and (11)

$$X_k^{(1)} = X_k^{(0)} - \Delta X_k^{(1)} \tag{10}$$

$$Y_k^{(1)} = Y_k^{(0)} - \Delta Y_k^{(1)}, \tag{11}$$

and replaces the estimated spot-image positions as current ones in the position data storing area 42 with the new estimated spot-image positions $P_k^{(1)}[X_k^{(1)}, Y_k^{(1)}]$.

Until the answer in the step 125 becomes YES, the steps 122 through 126, i.e. a below process a. through e., are repeated.

a. The image-information calculating unit 35 calculates from the equation (12) image data $J^{(j+1)}(X, Y)$ assuming current estimated spot-image positions $P_k^{(j)}[X_k^{(j)}, Y_k^{(j)}]$ (j=1, 2, ...) to be real spot-image positions (step 122)

$$J^{(j+1)}(X,Y) = F[P_k^{(j)}[X_k^{(j)}, Y_k^{(j)}]]. \tag{12}$$

b. The spot-image position calculating unit 34 calculates comparison spot-image positions $CP_k^{(j+1)}[CX_k^{(j+1)}, CY_k^{(j+1)}]$ based on image data $J^{(j+1)}(X, Y)$ from the equation (13) (step 123)

$$CP_k^{(j+1)}[CX_k^{(j+1)}, CY_k^{(j+1)}] = G[J^{(j+1)}(X,Y)]. \tag{13}$$

c. The judging-updating unit 36 calculates the differences $\Delta X_k^{(j+1)}, \Delta Y_k^{(j+1)}$ (k-1, 2, ...) between the initial estimated spot-image positions $P_k^{(0)}[X_k^{(0)}, Y_k^{(0)}]$ and comparison spot-image positions $CP_k^{(j+1)}[CX_k^{(j+1)}, CY_k^{(j+1)}]$ using the equations (14) and (15) (step 124)

$$\Delta X_k^{(j+1)} = CX_k^{(j+1)} - X_k^{(0)} \tag{14}$$

$$\Delta Y_k^{(j+1)} = CY_k^{(j+1)} - Y_k^{(0)} \tag{15}$$

d. The judging-updating unit 36 checks whether or not the absolute values of all the differences are at or below the permissible limit (step 125).

e. The judging-updating unit 36 calculates new estimated spot-image positions $P_k^{(j+1)}[X_k^{(j+1)}, Y_k^{(j+1)}]$ from the equations (16) and (17)

$$X_k^{(j+1)} = X_k^{(j)} - \Delta X_k^{(j+1)} \tag{16}$$

$$Y_k^{(j+1)} = Y_k^{(j)} - \Delta Y_k^{(j+1)}, \tag{17}$$

and updates the estimated spot-image positions (step 126).

If the answer in the step 125 is YES, the judging-updating unit 36 stores in the position data storing area 42 the estimated spot-image positions as the detection result of spot image positions in a step 127.

When the detection of the spot image positions has been completed, the process proceeds from the subroutine 114 to a step 115 in FIG. 7.

In the step 115 the wave-front-aberration calculating unit 33 reads out the detection result of the spot image positions from the position data storing area 42 and calculates the wave-front-aberration of light through the first pinhole-like feature $PH_1$ of the measurement reticle RT due to the projection optical system PL. The wave-front-aberration is given by calculating the coefficients of Zernike polynomials based on the differences between spot image positions expected if no wave-front-aberration exists and the spot image positions detected, and is stored together with the position of the pinhole-like feature PH, in the wave-front-aberration-data storing area 44.

Next, a step 116 checks whether or not the wave-front-aberration due to the projection optical system PL for all the pinhole-like features have been calculated. Because at this point of time only that for the first pinhole-like feature $PH_1$ has been calculated, the answer is NO, and the process proceeds to a step 117.

In the step 117 the wafer stage WST is moved so that the opening 91a of the mark plate 91 of the wave-front sensor 90 is positioned at a position conjugate to the pinhole-like feature $PH_2$ with respect to the projection optical system PL. The main control system 20 controls such movement via the stage control system 19 and the wafer-stage driving portion 24 based on position information (or speed information) of the wafer stage WST from the wafer interferometer 18. Also in this case, the main control system 20 drives the wafer stage WST finely in the Z-direction via the wafer-stage driving portion 24 based on a detection result from the multi-focal detection system (21, 22) so that the image plane on which the pinhole-like feature $PH_2$ is imaged coincides with the upper surface of the mark plate 91 of the wave-front sensor 90.

Also when moving the upper surface of the mark plate 91 of the wave-front sensor 90 to the image plane on which an image of the pinhole-like feature $PH_2$ is formed, the position of the wafer stage WST is, as described above, controlled based on the components, due to position deviation of the upper surface of the mark plate 91 from the image plane of the projection optical system PL, calculated based on wave-front-aberration data obtained by the wave-front-aberration measuring unit 70, which control is preferably performed for each pinhole-like feature.

Subsequently, the wave-front-aberration due to the projection optical system PL is measured in the same way as for the pinhole-like feature $PH_1$, and the measurement result is stored together with the position of the inhole-like feature $PH_2$ in the wave-front-aberration-data storing area 44.

After that, the wave-front-aberrations due to the projection optical system PL for all the pinhole-like features are sequentially measured likewise and stored in the wave-front-aberration-data storing area 44. When the wave-front-aberrations due to the projection optical system PL for all the pinhole-like features have been measured, the answer in the step 116 is YES. And the controller 39 reads out the measurement results of the wave-front-aberrations from the wave-front-aberration-data storing area 44 and supplies them as wave-front-measurement data WFA to the main control system 20. Then the process proceeds to a step 102 in FIG. 6.

In the step 102, the main control system 20 checks based on the wave-front-measurement data WFA from the controller 39 whether or not the wave-front-aberrations due to the projection optical system PL are at or below a permissible limit. While, if the answer is YES, the process proceeds to a step 104, if the answer is NO, the process proceeds to a step 103. At this point of time the answer is NO, and the process proceeds to the step 103.

In the step 103, the main control system 20 adjusts the projection optical system PL based on the wave-front-aberration measurement results so as to reduce the wave-front-aberration. In the adjustment the controller 39 may move the lens elements via the imaging-characteristic correcting controller 51 or, if necessary, the lens elements of the projection optical system PL may be manually moved on the X-Y plane or replaced.

Subsequently, in the subroutine 101 the wave-front-aberrations due to the projection optical system PL adjusted is measured likewise. Until the answer in the step 102 becomes YES, the adjustment of the projection optical system PL in terms of the wave-front-aberration (step 103) and the measurement of the wave-front-aberration (step 101) are repeated. And when the answer in the step 102 becomes YES, the process proceeds to a step 104.

In the step 104, after the wave front sensor 90 has been removed from the wafer stage WST, and the wave-front-data processing unit 80 is disconnected from the main control system 20, a reticle loader (not shown) loads a reticle R having a given pattern formed thereon onto the reticle stage RST under the control of the main control system 20, and a wafer loader (not shown) loads a wafer W subject to exposure onto the wafer stage WST.

Next, in a step 105, measurement for exposure is performed under the control of the main control system 20, such as reticle alignment using a reference mark plate (not shown) on the wafer stage WST and measurement of baseline amount using the alignment detection system AS. When the exposure of the wafer W is for a second or later layer, the arrangement coordinates of shot areas on the wafer W are detected very accurately by the above EGA measurement using the alignment detection system AS so that the layer pattern to be formed can be very accurately aligned with previous layers' pattern already formed thereon.

Next, in a step 106, before exposure the wafer stage WST is moved so that a first shot area on the wafer W is positioned at a scan start position for exposure. The main control system 20 controls such movement via the stage control system 19 and the wafer-stage driving portion 24 based on position information (or speed information) of the wafer stage WST from the wafer interferometer 18 and, if the second or later layer, the detection result of the positional relation between a reference coordinate system and the arrangement coordinate system as well. At the same time the reticle stage RST is moved so that the reticle R is positioned at a scan start position for reticles, via the stage control system 19 and a reticle-stage driving portion (not shown) by the main control system 20.

Next, the stage control system 19, according to instructions from the main control system 20, performs scan exposure while adjusting the position of the wafer W surface based on the Z-direction position information of the wafer W from the multi-focus-position detection system (21, 22), the X-Y position information of the reticle R from the reticle interferometer 16 and the X-Y position information of the wafer W from the wafer interferometer 18 and moving relatively the reticle R and wafer W via the reticle-stage driving portion (not shown) and via the wafer-stage driving portion 24.

After the completion of exposure of the first shot area, the wafer stage WST is moved so that a next shot area is positioned at the scan start position for exposure, and at the same time the reticle stage RST is moved so that the reticle R is positioned at the scan start position for reticles. The scan exposure of the shot area is performed in the same way as the first shot area. After that, the scan exposure is repeated until all shot areas have been exposed.

In a step 107 an unloader (not shown) unloads the exposed wafer W from the wafer holder 25, by which the exposure of the wafer W is completed.

In the exposure of later wafers, the wafer exposure sequence of the steps 104 through 107 is performed with, if necessary, measuring and adjusting wave-front aberration due to the projection optical system PL (steps 101 through 103).

As described above, according to this embodiment, estimated spot-image positions are calculated based on an image-pick-up result using the specific algorism and are set as initial estimated spot-image positions. And the whole image data on the image plane is calculated assuming the estimated spot-image positions to be real spot-image positions; comparison spot-image positions are calculated based on the whole image data using the specific algorism, and the estimated spot-image positions as current ones are replaced with new estimated spot-image positions given by correcting the estimated spot-image positions by the absolute values of the differences between the initial estimated spot-image positions and the comparison spot-image positions to improve sequentially the accuracy of the estimated spot-image positions approximating the real spot-image positions. Therefore, the real spot-image positions can be accurately detected.

Moreover, the wave-front aberration due to the projection optical system PL can be accurately calculated based on the real spot-image positions accurately detected.

Furthermore, because the projection optical system PL is adjusted in terms of the wave-front aberration based on the accurately calculated wave-front aberration due to the projection optical system PL, and the given pattern of the reticle R is projected onto a wafer W through the projection optical system PL that causes little aberration, the given pattern can be very accurately transferred on the wafer W.

While in the above embodiment the number of the pinhole-like features of the measurement reticle RT is nine, more or less than nine pinhole-like features may be provided depending on the desired accuracy in measurement of wave-front aberration. Also, the number and arrangement of micro lenses 94a in the micro-lens array 94 can be changed depending on the desired accuracy in measurement of wave-front aberration.

Moreover, while, in the above embodiment when checking the differences between the initial estimated spot-image positions and the comparison spot-image positions, whether or not the absolute values of all the differences $\Delta X_k^{(j+1)}$, $\Delta Y_k^{(j+1)}$ are at or below a permissible limit is checked, whether values $\{(\Delta X_k^{(j+1)})^2+(\Delta Y_k^{(j+1)})^2\}$ or $\{(\Delta Xhd\ k^{(j+1)})^2+(\Delta Y_k^{(j+)})^2\}^{1/2}$ are at or below a permissible limit may be checked instead.

Furthermore, In this embodiment the following method can be adopted in order to improve the measurement accuracy.

That is, in order to reduce the sampling error of the CCD 95, an intensity distribution is calculated with using interpolation process based on data obtained by stepping the wave-front sensor 90 in a given direction, e.g., N times by PT/N, where PT indicates the cell size of the CCD 95, which intensity distribution is in a position-resolving power of N times that of an intensity distribution based on data obtained in a usual way without stepping. It is remarked that in order to improve the position-resolving power in two dimensions, the wave-front sensor 90 needs to be stepped in two dimensions.

The method of stepping comprises shifting the wave-front sensor 90 in a direction perpendicular to the optical axis of the wave-front-aberration measurement optical system or tilting the wave-front sensor 90 about the opening 91a of the wave-front sensor 90. But not limited to shifting the whole wave-front sensor 90, the micro-lens array 94 or the CCD 95 of the wave-front sensor 90 may be shifted in a direction perpendicular to the optical axis of the wave-front-aberration measurement optical system with the other elements fixed in their positions.

In addition, although in the above embodiment the spot-image is used in detecting the position, an image having another shape may be used.

Furthermore, although in the above embodiment the wave-front-aberration measuring unit 70 is removed from the exposure-apparatus main body 60 before exposure, needless to say, exposure may be performed without removing the wave-front-aberration measuring unit 70.

In addition, in the above embodiment a second CCD for measuring the shape of the pupil of an optical system to be examined may be provided. For example, in FIG. 2 the second CCD may be arranged behind a half mirror in place of the reflection mirror 96b and at a position optically conjugate to the pupil of the optical system to be examined. The center of the CCD 95 can be made to coincide with the center of the projection optical system's pupil by using the second CCD, so that the position deviations of spot images from the center of the pupil can be measured.

In addition, while the above embodiment describes the case where the scan-type exposure apparatus is employed, this invention can be applied to any exposure apparatus having a projection optical system regardless of whether it is of a step-and-repeat type, a step-and-scan type, or a step-and-stitching type.

Yet further, while in the above embodiment this invention is applied to aberration measurement of the projection optical system of an exposure apparatus, not being limited to an exposure apparatus, this invention can be applied to aberration measurement of imaging optical systems of other kinds of apparatuses.

Yet further, this invention can also be applied to, for example, measurement of an optical characteristic of a reflection mirror and the like.

<<Manufacture of Devices>>

Next, the manufacture of devices by using the above exposure apparatus and method will be described.

Figure 13:
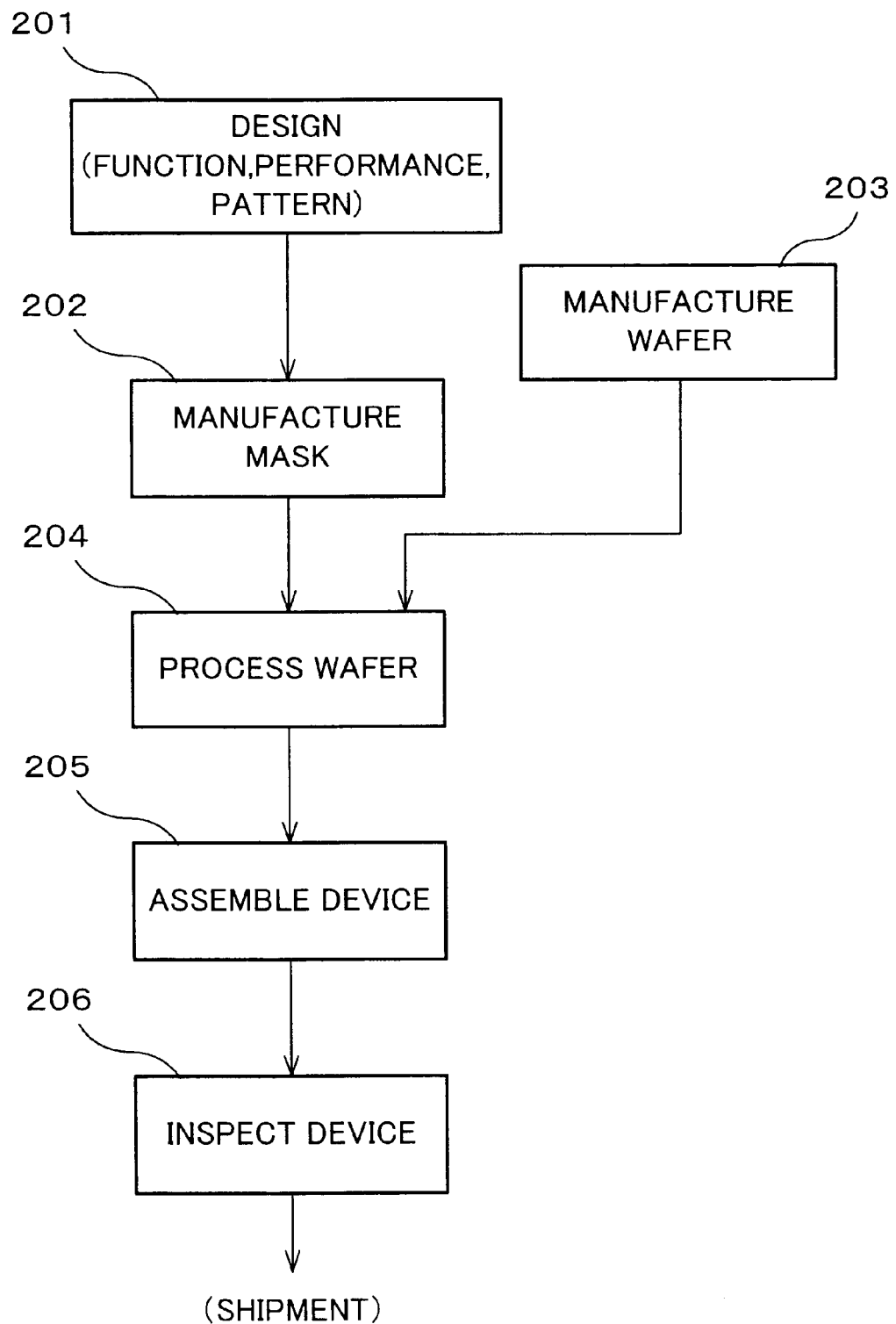
FIG. 13 is a flow chart for explaining the method of manufacturing devices using the exposure apparatus shown in FIG. 1.

FIG. 13 is a flow chart for the manufacture of devices (semiconductor chips such as IC or LSI, liquid crystal panels, CCD's, thin magnetic heads, micro machines, or the like) in this embodiment. As shown in FIG. 13, in step 201 (design step), function/performance design for the devices (e.g., circuit design for semiconductor devices) is performed and pattern design is performed to implement the function. In step 202 (mask manufacturing step), masks on which a different sub-pattern of the designed circuit is formed are produced. In step 203 (wafer manufacturing step), wafers are manufactured by using silicon material or the like.

In step 204 (wafer processing step), actual circuits and the like are formed on the wafers by lithography or the like using the masks and the wafers prepared in steps 201 through 203, as will be described later. In step 205 (device assembly step), the devices are assembled from the wafers processed in step 204. Step 205 includes processes such as dicing, bonding, and packaging (chip encapsulation).

Finally, in step 206 (inspection step), a test on the operation of each of the devices, durability test, and the like are performed. After these steps, the process ends and the devices are shipped out.

Figure 14:
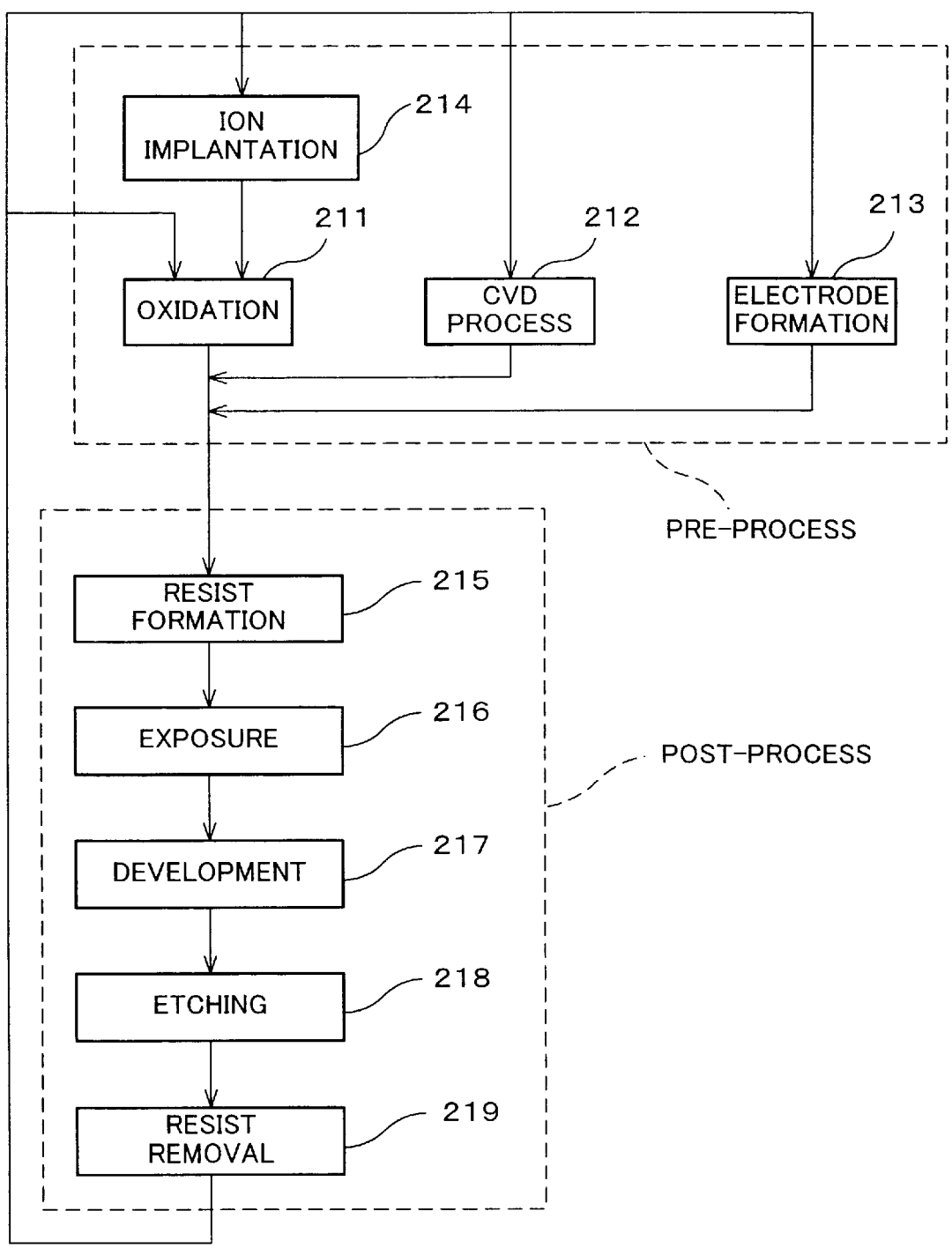
FIG. 14 is a flow chart showing the process in the wafer process step of FIG. 13.

FIG. 14 is a flow chart showing a detailed example of step 204 described above in manufacturing semiconductor devices. Referring to FIG. 14, in step 211 (oxidation step), the surface of a wafer is oxidized. In step 212 (CVD step), an insulating film is formed on the wafer surface. In step 213 (electrode formation step), electrodes are formed on the wafer by vapor deposition. In step 214 (ion implantation step), ions are implanted into the wafer. Steps 211 through 214 described above constitute a pre-process for each step in the wafer process and are selectively executed in accordance with the processing required in each step.

When the above pre-process is completed in each step in the wafer process, a post-process is executed as follows. In this post-process, first of all, in step 215 (resist formation step), the wafer is coated with a photosensitive material (resist). In step 216, the above exposure apparatus transfers a sub-pattern of the circuit on a mask onto the wafer according to the above method. In step 217 (development step), the exposed wafer is developed. In step 218 (etching step), an exposing member on portions other than portions on which the resist is left is removed by etching. In step 219 (resist removing step), the unnecessary resist after the etching is removed.

By repeatedly performing these pre-process and post-process, a multiple-layer circuit pattern is formed on each shot-area of the wafer.

In the above manner, the devices on which a fine pattern is accurately formed are manufactured.

Although the embodiments according to the present invention are preferred embodiments, those skilled in the art of lithography systems can readily think of numerous additions, modifications and substitutions to the above embodiments, without departing from the scope and spirit of this invention. It is contemplated that any such additions, modifications and substitutions will fall within the scope of the present invention, which is defined by the claims appended hereto.

What is claimed is:

1. An optical characteristic measuring method for measuring an optical characteristic of an optical system to be examined, the optical characteristic measuring method comprising:

dividing a wave front of light which has passed through the optical system to be examined, by a predetermined optical system to form an image having a plurality of features;

picking up the image having the plurality of features;

calculating an initial estimated feature position of at least one feature out of the plurality of features using a specific algorithm based on the picked-up image;

calculating image information using a model for the predetermined optical system in view of the feature being formed in a current estimated feature position;

calculating a comparison feature position using the specific algorithm based on the image information;

correcting the current estimated feature position by amounts corresponding to differences between the initial estimated feature position and the comparison feature position, so that the current estimated feature position is updated; and performing the calculating of the image information, the calculating of the comparison feature position, and the correcting and updating of the current estimated feature position, until the differences between the initial estimated feature position and the comparison feature position become at or below the permissible limit, and calculating an optical characteristic of the optical system to be examined in consideration of the current estimated feature position for which the differences between the initial estimated feature position and the comparison feature position become at or below the permissable limit.

2. An optical characteristic measuring method according to claim 1, wherein the optical characteristic is a wave-front aberration.

3. An optical characteristic measuring method according to claim 1, wherein the calculating of the image information, the calculating of the comparison feature position, and the correcting and updating of the current estimated feature position are repeatedly performed until the differences between the initial estimated feature position and the comparison feature position become at or below the permissible limit.

4. An optical characteristic measuring method according to claim 1, wherein the optical system to be examined is a projection optical system that transfers a pattern formed on a mask onto a substrate.

5. An optical characteristic measuring method according to claim 4, wherein the at least one feature is a feature located in the vicinity of the periphery of an area corresponding to a pupil of the projection optical system.

6. An optical characteristic measuring method according to claim 1, wherein the predetermined optical system includes a micro-lens array in which lens elements are arranged in a matrix.

7. An optical characteristic measuring method according to claim 1, wherein the specific algorithm is one of a center-of-gravity method and a correlation method.

8. An optical characteristic measuring method according to claim 1, wherein the at least one feature is a spot.

9. An optical characteristic measuring unit which measures an optical characteristic of an optical system to be examined, the optical characteristic measuring unit comprising:

a wave-front dividing device which is arranged on an optical path of light passing through the optical system to be examined, divides a wave front of the light passing through the optical system to be examined, and forms an image having a plurality of features;

a pick-up unit which is arranged a predetermined distance apart from the wave-front dividing device and picks up the image having the plurality of features;

a position detecting unit connected to the pick-up unit, which detects positions of the plurality of features in the picked-up image, wherein the position detecting unit calculates an initial estimated feature position of at least one feature out of the plurality of features using a specific algorithm based on the picked-up image; calculates image information using a model for the predetermined optical system in view of the feature being formed in a current estimated feature position; calculates a comparison feature position using the specific algorithm based on the image information; corrects the current estimated feature position by amounts corresponding to differences between the initial estimated feature position and the comparison feature position, so that the current estimated feature position is updated; and performs the calculating of the image information, the calculating of the comparison feature position, and the correcting and updating of the current estimated feature position, until the differences between the initial estimated feature position and the comparison feature position become at or below a permissible limit, and an optical characteristic calculating unit connected to the position detecting unit, which calculates an optical characteristic of the optical system to be examined in consideration of the current estimated feature position for which the differences between the initial estimated feature position and the comparison feature position become at or below the permissable limit.

10. An optical characteristic measuring unit according to claim 9, wherein the wave-front dividing device is a micro-lens array in which lens elements are arranged in a matrix.

11. An optical characteristic measuring unit according to claim 9, wherein the optical system to be examined is a projection optical system that transfers a pattern formed on a mask onto a substrate.

12. An optical characteristic measuring unit according to claim 11, wherein a housing that houses the wave-front dividing device and the pick-up unit is attached to a stage that holds the substrate.

13. An optical characteristic measuring unit according to claim 11, wherein the at least one feature is a feature located in a vicinity of a periphery of an area corresponding to a pupil of the projection optical system.

14. An optical characteristic measuring unit according to claim 13, wherein the optical characteristic includes a wave-front aberration of the projection optical system.

15. An optical characteristic measuring unit according to claim 9, wherein the calculating of the image information, the calculating of the comparison feature position, and the correcting and updating of the current estimated feature position are repeatedly performed until the differences between the initial estimated feature position and the comparison feature position become at or below the permissible limit.

16. An exposure apparatus which, by illuminating a substrate with exposure light, transfers a predetermined pattern onto a substrate, comprising:

an exposure apparatus main body which comprises a projection optical system arranged on an optical path of the exposure light;

a wave-front dividing device which is arranged on an optical path of light passing through the projection optical system, divides a wave front of the light passing through the projection optical system, and forms an image having a plurality of features;

a pick-up unit which is arranged a predetermined distance apart from the wave-front dividing device and picks up the image having the plurality of features;

a position detecting unit connected to the pick-up unit, which detects positions of the plurality of features in the picked-up image, wherein the position detecting unit calculates an initial estimated feature position of at least one feature out of the plurality of features using a specific algorithm based on the picked-up image; calculates image information using a model for the predetermined optical system in view of the feature being formed in a current estimated feature position; calculates a comparison feature position using the specific algorithm based on the image information; corrects the current estimated feature position by amounts corresponding to differences between the initial estimated feature position and the comparison feature position, so that the current estimated feature position is updated; and performs the calculating of the image information, the calculating of the comparison feature position, and the correcting and updating of the current estimated feature position, until the difference between the initial estimated feature position and the comparison feature position become at or below a permissible limit, and an optical characteristic calculating unit connected to the position detecting unit, which calculates an optical characteristic of the projection optical system in consideration of the current estimated feature position for which the differences between the initial estimated feature position and the comparison feature position become at or below the permissable limit.

17. An exposure apparatus according to claim 16, wherein the optical characteristic measuring unit is attachable to and detachable from the exposure apparatus main body.

18. A device manufacturing method including a lithography process, wherein in the lithography process, an exposure apparatus according to claim 16 performs exposure.

19. An exposure apparatus according to claim 16, wherein the optical characteristic includes a wave-front aberration of the projection optical system.

20. An exposure apparatus according to claim 16, wherein the at least one feature is a feature located in a vicinity of a periphery of an area corresponding to a pupil of the projection optical system.

* * * * *